(12) United States Patent
Hollmer et al.

(10) Patent No.: US 8,369,132 B1
(45) Date of Patent: Feb. 5, 2013

(54) METHODS OF PROGRAMMING AND ERASING PROGRAMMABLE METALLIZATION CELLS (PMCS)

(75) Inventors: Shane Charles Hollmer, Grass Valley, CA (US); Nad Edward Gilbert, Gilbert, AZ (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/337,004

(22) Filed: Dec. 23, 2011

Related U.S. Application Data

(62) Division of application No. 12/508,212, filed on Jul. 23, 2009, now Pat. No. 8,107,273.

(60) Provisional application No. 61/137,263, filed on Jul. 28, 2008.

(51) Int. Cl.
*G11C 11/00* (2006.01)
*G11C 11/34* (2006.01)

(52) U.S. Cl. ...................................... 365/148; 365/178

(58) Field of Classification Search .................. 365/148, 365/178
See application file for complete search history.

(56) References Cited

U.S. PATENT DOCUMENTS

| 7,514,706 | B2 * | 4/2009 | Gilbert | 257/3 |
| 2007/0058417 | A1 * | 3/2007 | Roehr | 365/148 |
| 2009/0067229 | A1 * | 3/2009 | Kang et al. | 365/163 |
| 2010/0128519 | A1 * | 5/2010 | Li et al. | 365/171 |
| 2011/0032748 | A1 * | 2/2011 | Jung et al. | 365/148 |

OTHER PUBLICATIONS

U.S. Appl. No. 12/508,212, filed Jul. 23, 2009, the parent application to this Divisional Application.

* cited by examiner

*Primary Examiner* — Ly D Pham

(57) ABSTRACT

A method can include programming a selected programmable metallization cell (PMC) by coupling the anodes of a group of PMCs to a first power supply voltage and connecting a cathode of one of PMCs of the group to a second power supply voltage with a select device; and erasing a selected PMC by coupling the anodes of a group of PMCs to the second power supply voltage and connecting the cathode of one of PMCs of the group to the first supply voltage with the select device.

17 Claims, 16 Drawing Sheets

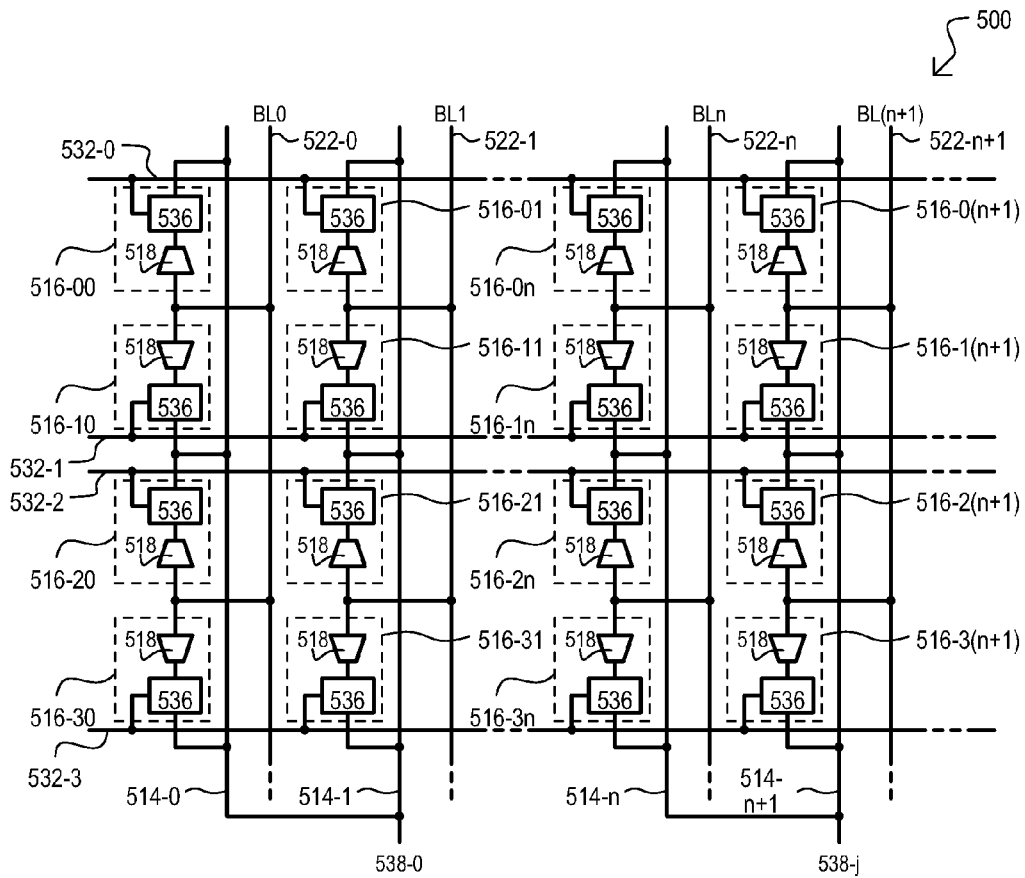
FIG. 5
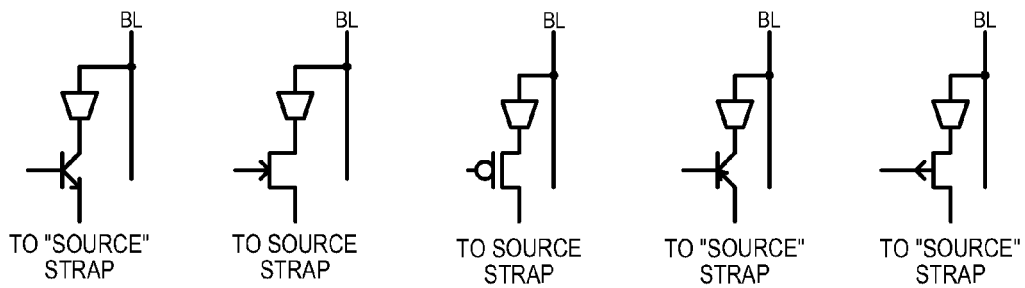
| FIG. 6A | FIG. 6B | FIG. 6C | FIG. 6D | FIG. 6E |

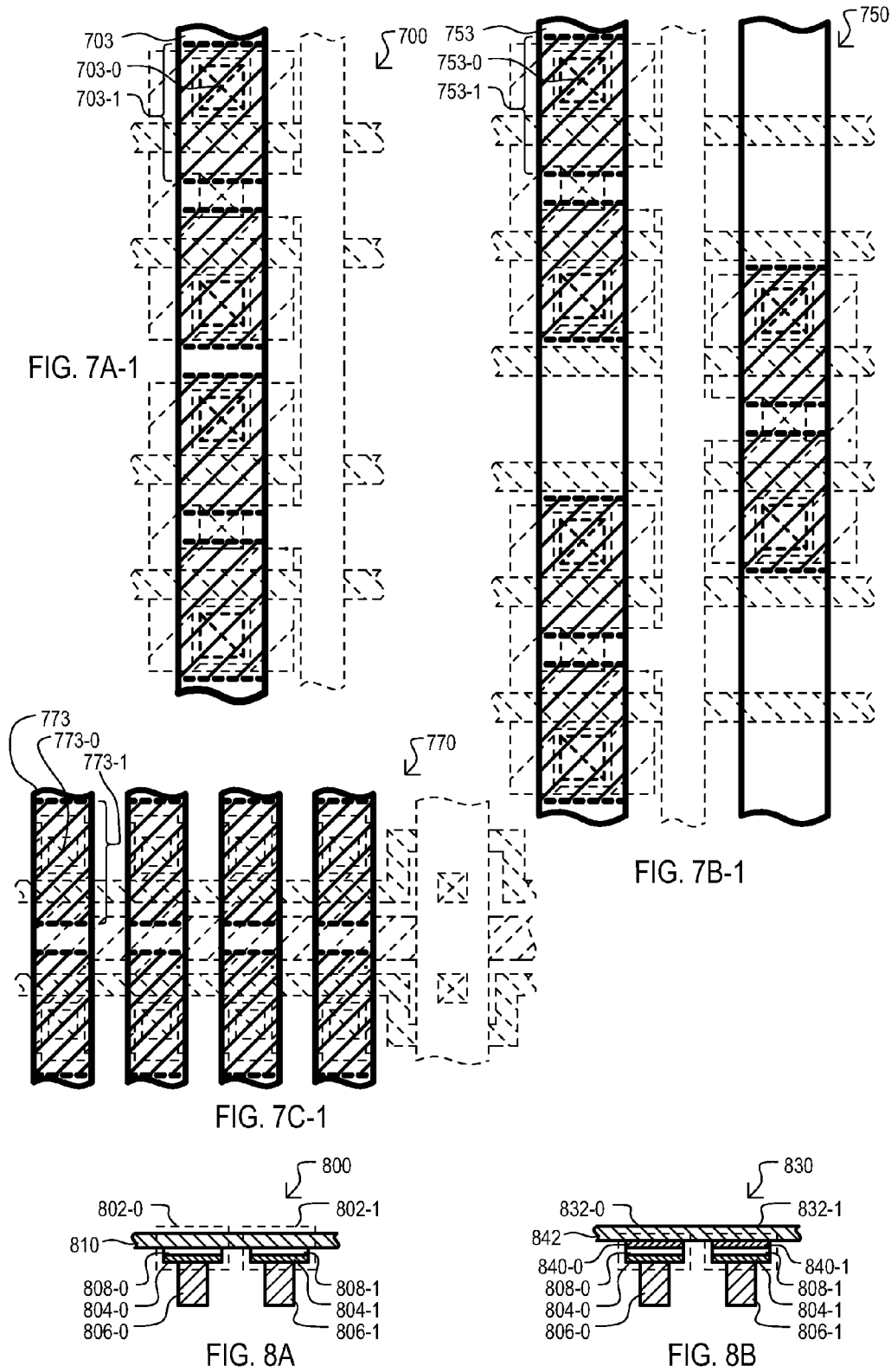

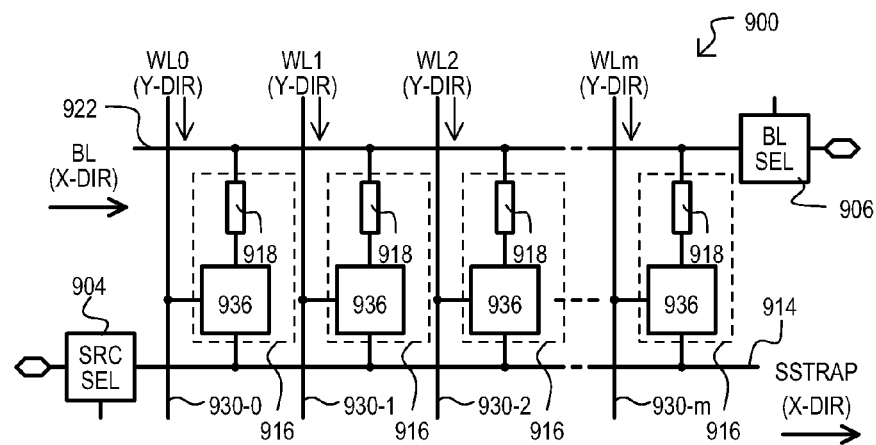
FIG. 9
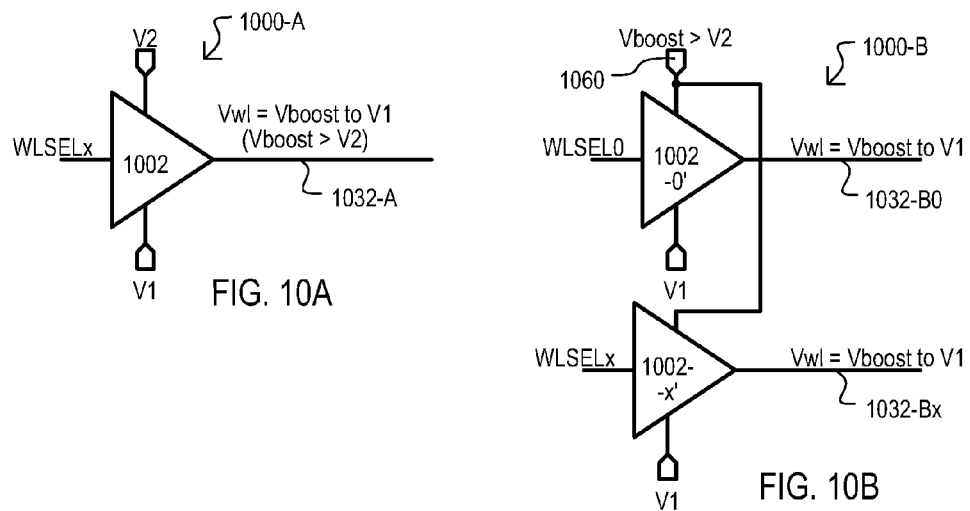
FIG. 10A
FIG. 10B
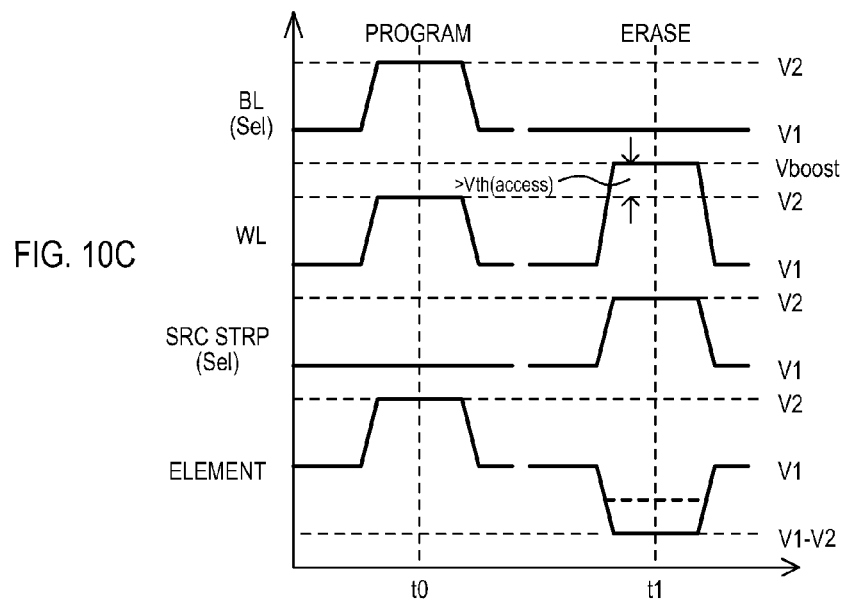
FIG. 10C

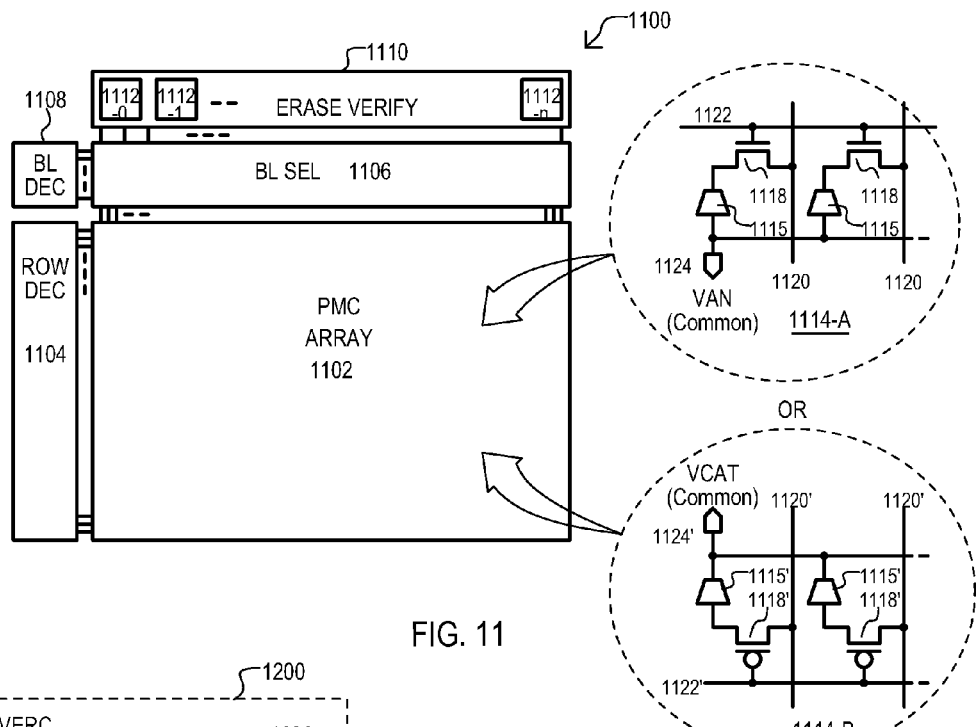
FIG. 11
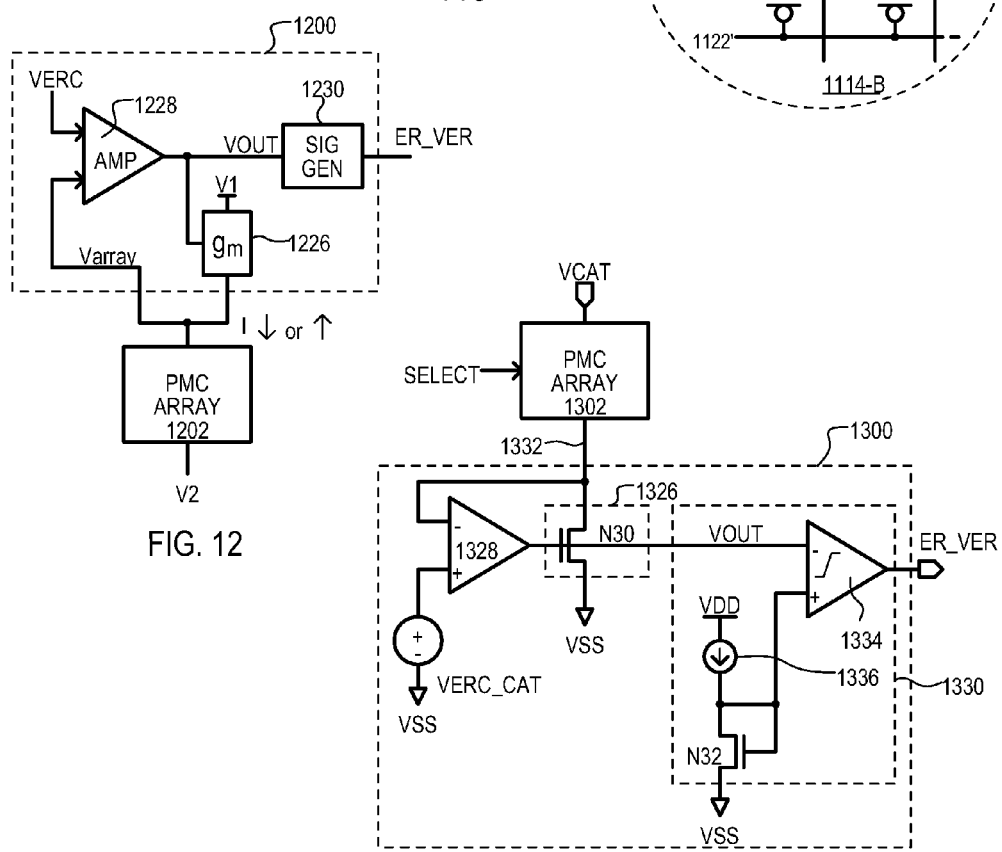
FIG. 12
FIG. 13

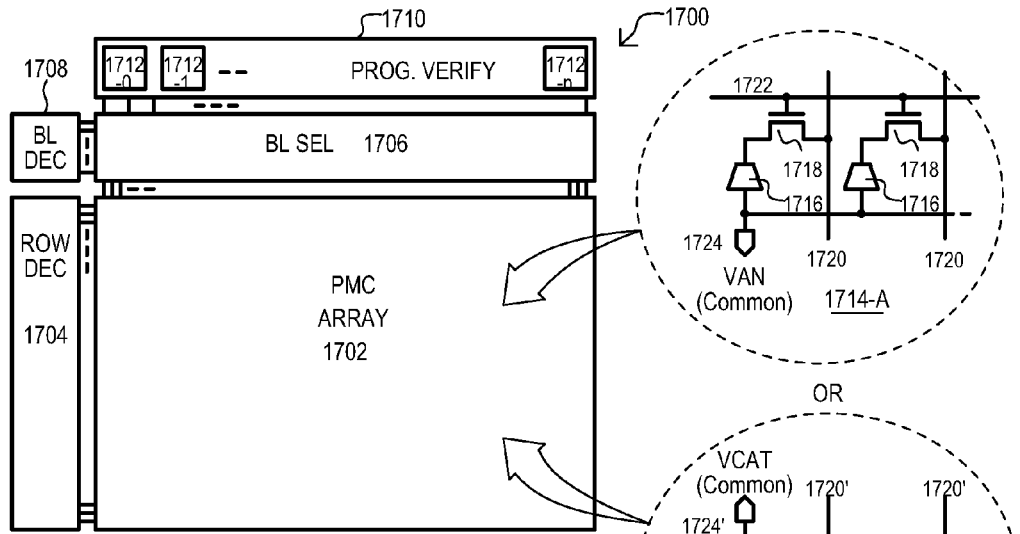
FIG. 17
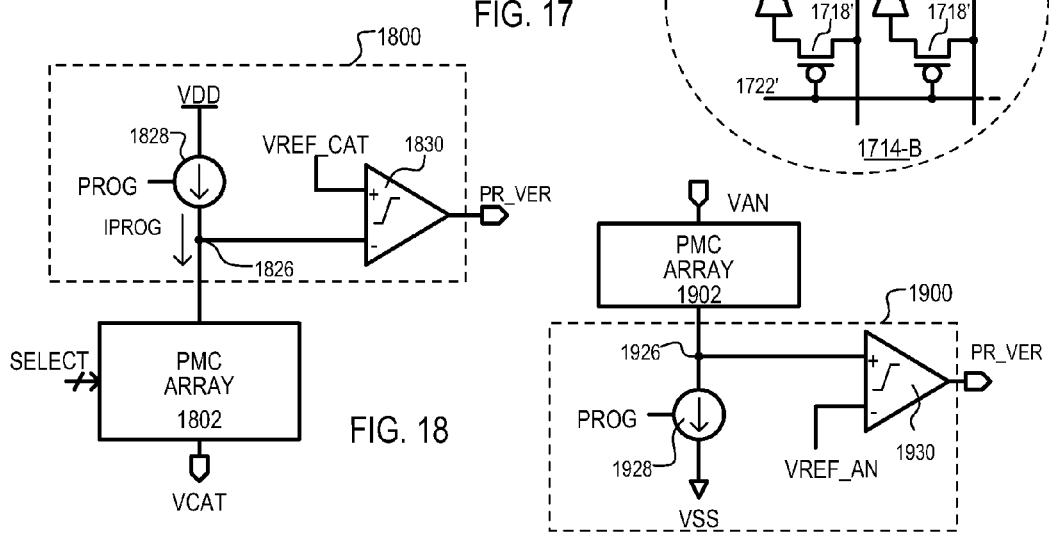
FIG. 18
FIG. 19
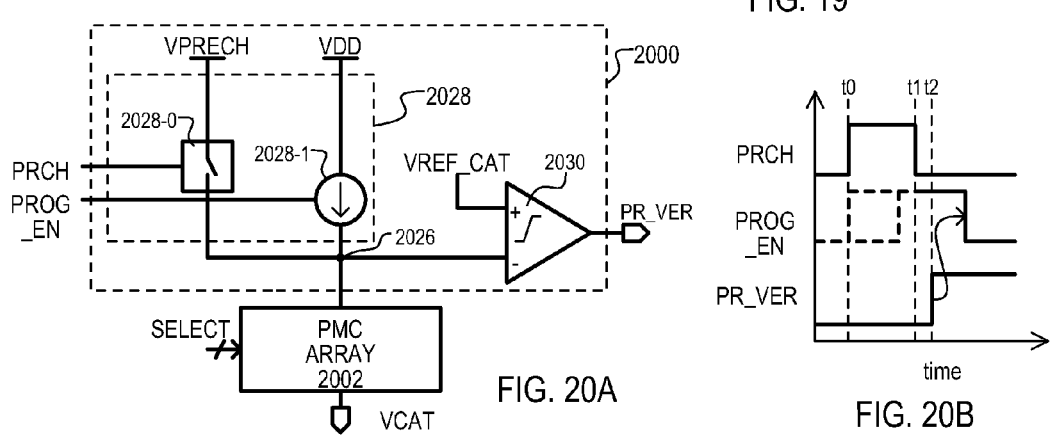
FIG. 20A
FIG. 20B

US 8,369,132 B1

METHODS OF PROGRAMMING AND ERASING PROGRAMMABLE METALLIZATION CELLS (PMCS)

This application is a divisional of U.S. patent application Ser. No. 12/508,212 filed on Jul. 23, 2009, which claims the benefit of U.S. Provisional Patent Application Ser. No. 61/137,263, filed Jul. 28, 2008, the contents of both of which are incorporated by reference herein.

TECHNICAL FIELD

The present invention relates generally to semiconductor integrated circuit devices, and more particularly to architectures for memory devices having programmable metallization cells (PMCs) as data storage elements.

BRIEF SUMMARY OF THE INVENTION

An integrated circuit can include a plurality of programmable metallization cells (PMCs) each comprising an ion conducting material and a metal dissolvable in the ion conducting material, and each having an anode terminal formed from an active metal dissolvable into an ion conductor and a cathode terminal formed from an inert metal that does not dissolve into the ion conductor. A plurality of bit lines can be included, each bit line being coupled to a plurality of anodes of a different set of PMCs, and providing a read data path from a selected one of the set of PMCs. A plurality of access devices can also be included that each provides a controllable impedance path between at least one cathode and a common source node. Common source nodes can be shared diffusions between multiple memory access devices, allowing for a compact PMC memory array.

BRIEF DESCRIPTION OF THE DRAWINGS

FIG. 5 is a block schematic diagram of a PMC array according to an embodiment. FIGS. 6A to 6E show alternate memory cells that can be included in the embodiments.

FIGS. 7A-0 to 7C-1 are top plan views showing source strapping examples according to three particular embodiments.

FIGS. 8A and 8B are side cross sectional views of other embodiments.

FIG. 9 is a schematic layout diagram of a memory device according to another embodiment.

FIGS. 10A to 10C are schematic and timing diagrams showing word line driver circuits that may be included in embodiments.

FIG. 11 is a block schematic diagram of a memory device according to an embodiment.

FIG. 12 is a block schematic diagram showing an erase and verify circuit section according to one embodiment.

FIG. 13 is a block schematic diagram showing an erase and verify circuit section according to another embodiment.

FIG. 17 is a block schematic diagram of a memory device according to a further embodiment.

FIG. 18 is a block schematic diagram of program and verify section according to an embodiment.

FIG. 19 is a block schematic diagram of a program and verify section according to another embodiment.

FIG. 20A is a block schematic diagram of a program and verify section according to another embodiment. FIG. 20B is a timing diagram showing an example of a programming operation for the circuit of FIG. 20A.

DETAILED DESCRIPTION OF THE EMBODIMENTS

Various embodiments of the present invention will now be described in detail with reference to a number of drawings. The embodiments show structures and methods of fabricating a memory array that can include programmable metallization cells (PMCs) that can be programmed and erased between one or more resistance and/or capacitive states.

Figure 1:
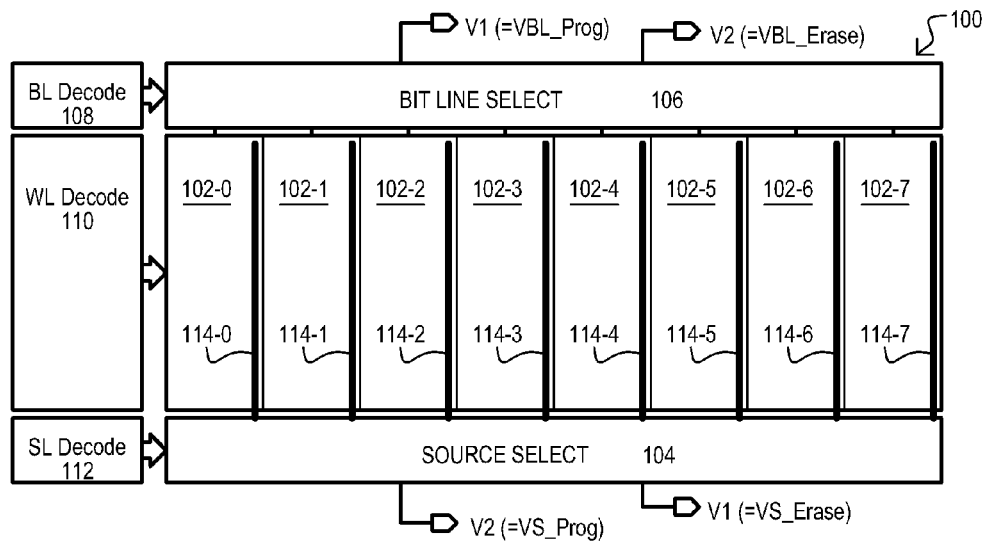
FIG. 1 is a block schematic diagram of a memory device according to a first embodiment.

Referring now to FIG. 1, a memory device according to a first embodiment is shown in block schematic diagram and designated by the general reference character 100. A memory device 100 can include PMC sectors 102-0 to 102-7, source node selection circuitry 104, bit line selection circuitry 106, bit line decoding circuitry 108, word line decoding circuitry 110, and source decoding circuitry 112. A memory device 100 can be a single integrated circuit or form a portion of a larger integrated circuit device that provides functions in addition to memory (i.e., can be an "embedded" memory).

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode) and the other electrode is relatively inert and does not dissolve during operation of the programmable device (an indifferent electrode). For example, one electrode may be an anode during a write process and be comprised of a material including silver that dissolves in an ion conductor while another electrode may be a cathode during the write process and be comprised of an inert material such as tungsten, nickel, molybdenum, platinum, metal silicides, and the like. Having at least one electrode formed of a material including a metal which dissolves in ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This is in contrast to other PMC memory device architectures that have bit lines connected to a corresponding PMC via the access device of the cell.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. A very particular example of such an arrangement in shown in FIG. 1, which illustrates source straps 114-0 to 114-7 extending in one direction (vertically in the figure). Again, such an arrangement can be in contrast to a PMC architecture in which access devices may be directly connected to a bit line.

While FIG. 1 shows eight PMC sectors (102-0 to 102-7), other embodiments may include fewer or greater numbers of PMC sectors.

Referring back to FIG. 1, source node selection circuitry 104 can selectively connect source straps (114-0 to 114-7) to various nodes depending upon the mode of operation and a source decoding value. In one particular example, source node selection circuitry 104 can connect a selected source strap (114-0 to 114-7) between at least two different voltages, V2 or V1. More particularly, in a program operation or read operation, a selected source strap can be connected to voltage V2. In contrast, in an erase operation, a selected source strap can be connected to voltage V1. Said in another way, voltage V2 can be considered a source program voltage (VS_Prog) and a source read voltage (VS_Read), while a voltage V1 can be considered a source erase voltage (VS_Erase). Preferably, voltages V1 and V2 are conventional power supply voltages, such as +5 and 0 volts, or +3.3 and 0 volts, or +1.2 and 0 volts. More particularly, in one embodiment, voltages V1 and/or V2 may be a power supply voltage received at an external pin of an integrated circuit including memory device 100. In another embodiment, voltages V1 and/or V2 may be a voltage generated by a voltage regulator of an integrated circuit that includes memory device 100.

In other arrangements, as will be shown in more detail below, source node selection circuitry 104 can also connect source straps (114-0 to 114-7) to an inhibit (e.g., de-select) voltage. An inhibit voltage can be applied to PMCs not selected for erase or program operation, and can help ensure that such de-selected PMCs are not adversely affected by such operations (disturbed).

In a similar fashion to source line selection circuitry 104, bit line selection circuitry 106 can selectively connect bit lines of one or more PMC sections (102-0 and 102-7) according to a mode of operation and bit line decoding values. In one particular example, bit line selection circuitry 106 can advantageously connect a selected bit to either of voltages V2 or V1. That is, in a program operation, a selected bit line can be connected to voltage V1, while in an erase operation, a selected bit line can be connected to voltage V2. Said in another way, voltage V1 can be considered a bit line program voltage (VBL_Prog), while a voltage V2 can be considered a bit line erase voltage (VBL_Erase). In a very particular embodiment, bit line selection circuitry 106 can include multiple layers of multiplexing.

As in the case of source node selection circuitry 104, bit line selection circuitry 106 can also connect bit lines to an inhibit voltage for PMCs not selected for erase or program.

It is noted that an arrangement like that shown in FIG. 1 can advantageously provide program and erase voltages without having to include charge pumps or the like, to a voltage that is outside of a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between voltages V1−V2 in an anode-to-cathode direction. In an erase operation, a PMC to be erased can be connected between voltages V2−V1 in an anode-to-cathode direction. This is in contrast to architectures that maintain a constant voltage on anodes of PMCs, and then provide program and erase voltages with respect to such a common anode voltage. In such a cases, a supply voltage must be equal to a program voltage plus an erase voltage (Vprog+Verase). In sharp contrast, in a symmetric operation according to an embodiment, a program voltage may be an erase voltage, which may both be a supply voltage (Vprog=V1−V2, Verase=V2−V1, Supply voltage=V2−V1).

Bit line decoding circuitry 108 can generate values for selecting given bit lines for read, program and erase operations. In one arrangement, in response to address information (such as column address data), bit line decoding circuitry 108 can generate bit line select signals for application to bit line select circuitry 108.

Word line decoding circuitry 110 can generate values for selecting a given set of memory cells by enabling access devices in one or more selected rows of PMC sections (102-0 to 102-7). In response to address information (such as row address data), one or more word lines can be driven to a select voltage to thereby enable the corresponding select device in a row of memory cells. In this way, the PMCs of the selected row can be connected to a source node. Word lines can extend in a direction different from source straps (114-0 to 114-7), preferably essentially perpendicular to source straps.

Source decoding circuitry 112 can generate values for selecting given source straps (114-0 to 114-7). In one arrangement, in response to address information (such as column address data), source decoding circuitry 112 can generate source select signals for application to source node select circuitry 108. Source decoding circuitry 112 can select a source strap corresponding to a same memory cell as a selected bit line, and thereby enable a program, read or erase operation.

In this way, a memory device can include PMCs as data storage elements with anodes commonly connected to bit lines and memory cell access devices connected to strapped and decoded sources. Such select circuitry can provide for symmetrical program and erase operations utilizing bit line decoding and source strap decoding.

Figure 2:
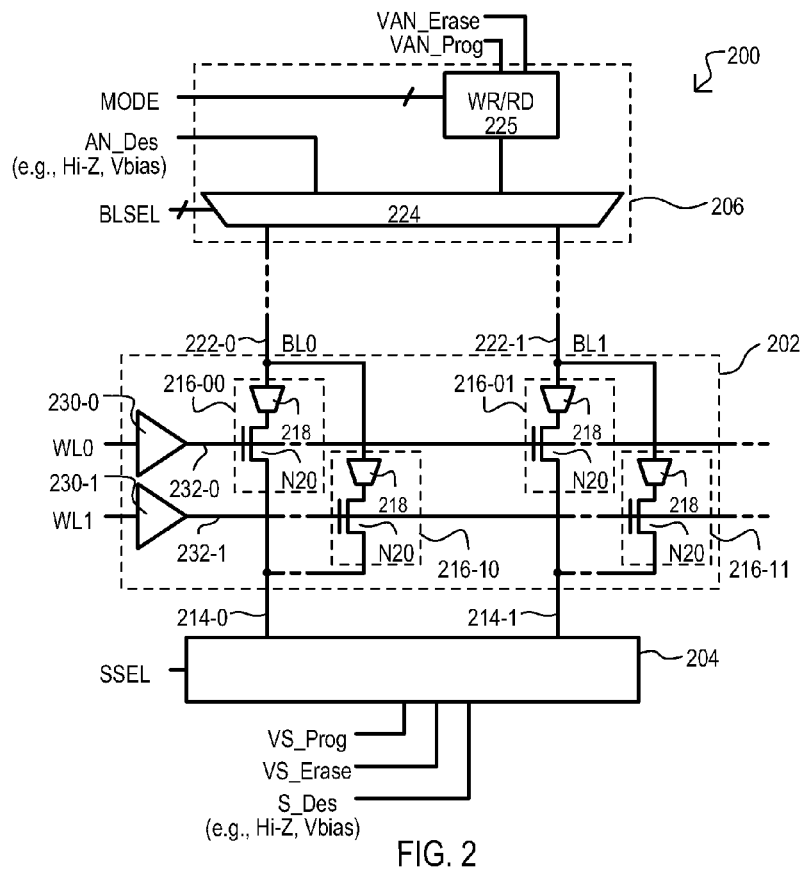
FIG. 2 is a block schematic diagram of a memory device according to a second embodiment.

Referring to FIG. 2, a memory device according to another embodiment is shown in a block schematic diagram and designated by the general reference character 200. In one example, the memory device 200 can be one implementation of the embodiment shown in FIG. 1. FIG. 2 shows a memory device 200 that can include features like those of FIG. 1. Such like features are referred to with a same reference character but with the first digit being a "2" instead of a "1".

Memory device 200 includes a PMC sector 202 that is shown for illustration purposes by four memory cells 216-00 to 216-11, arranged into four columns and two rows. Two memory cells are shown connected to each of two bit lines 222-0 and 222-1. It is understood that the arrangement can be repeated to form a much larger memory cell array structure. Each memory cell (216-00 to 216-11) can include a PMC 218 and an access device N20, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 218 may have a structure as described in conjunction with FIG. 1, or equivalents. In the example of FIG. 2, PMC sector 202 also includes word line drivers 230-0 and 230-1. Word line drivers (230-0 and 230-1) can drive corresponding word lines 232-0 and 232-1 to thereby select a memory cell (place its corresponding select device into a low impedance state).

In the example of FIG. 2, bit line select circuitry 206 can include a bit line multiplexer (MUX) 224 and read/write circuit 225. In FIG. 2, bit line MUX 224 can connect either of bit lines 222-0/1 to a read/write circuit 225 or a de-select state (AN_Des). That is, if a bit line 222-0/1 is selected for a write, program or read operation, such a bit line can be connected to read/write circuit 225. However, if the bit line 222-0/1 is not selected for such operations, it can be placed into the de-selected state. A de-select state AN_Des can be a high impedance state in the case of an "isolated" bit line architecture, or alternatively, can be a de-select bias voltage Vbias, in the case of a de-select bias architecture. Very particular examples of isolated bit line and de-select bias architectures are shown in other embodiments herein.

Read/write circuit 225 can vary in operation according to mode values MODE. In a program operation, read/write circuit 225 can connect a selected bit line to an anode program voltage (VAN_Prog). In an erase operation, read/write circuit 225 can connect a selected bit line to an anode erase voltage (VAN_Erase). In a read operation, read/write circuit 225 can connect a selected bit line to a read bias voltage (not shown in the figure).

Source line selection circuitry 204 can connect one or more of corresponding source straps 214-0/1 to a source program voltage (VS_Prog), a source erase voltage (VS_Erase), or a source de-select state (S_Des). As in the case of bit line selection circuitry 206, a source de-select state S_Des can be a high impedance state in the case of an "isolated" bit line architecture, or alternatively, can be the de-select bias voltage Vbias, in the case of a de-select bias architecture. Source line selection circuitry 204 can vary the number of source straps commonly driven to a same state. That is, source line selection circuitry 204 can select source straps connected to but one column of memory cells, or connected to multiple such columns.

Having described the various sections of FIG. 2, one example of the operation of such a memory device will now be described with reference to an operation that accesses memory cell 216-00. Initially, word lines 232-0/1 can be driven to a de-select voltage (e.g., low) by word line drivers 230-0/1. Bit line selection circuitry 206 can place bit lines 222-0/1 in the de-selected state. Similarly, source line selection circuitry 208 can place source straps 214-0/1 in the de-select state.

In a program operation, in response to address and mode data, bit line selection signals BLSEL can be active, resulting in bit line MUX 224 connecting bit line 222-0 to read/write circuit 225. In contrast, bit line 222-1 can be de-selected, and thus placed in the de-selected state (AN_Des). Mode selection values MODE can result in read/write circuit 225 connecting the selected bit line (in this example 222-0) to an anode program voltage (VAN_Prog). A program operation can also include source selection signals SSEL connecting source strap 214-0 to a source program voltage (VS_Prog), while connecting source strap 214-1 to a source de-select state (S_Des).

A word line driver (in this case 230-0) corresponding to the selected memory cell can be driven to a select voltage, thereby placing the selected PMC (PMC 218 of memory cell 216-00) between program voltages VAN_Prog and VS_Erase.

An erase operation can occur in the same general fashion, but with the anode erase voltage VAN_Erase being applied to the selected bit line and source erase voltage VS_Erase being applied to a selected source strap. As noted in the embodiment of FIG. 1, in particular embodiments, such an operation can be symmetrical, such that VAN_Prog=VS_Erase and VAN_Erase=VS_Prog.

While FIG. 2 shows n-channel MOS transistors as access devices, other embodiments may include different types of access devices. In such alternate embodiments, word line drivers (e.g., 230-0/1) would provide appropriate voltage currents to enable such access devices.

In this way, bit line selection, source selection, and word line activation can be utilized to program and/or erase a PMC array having bit lines connected to anodes of PMCs within multiple memory cells.

Figure 3A:
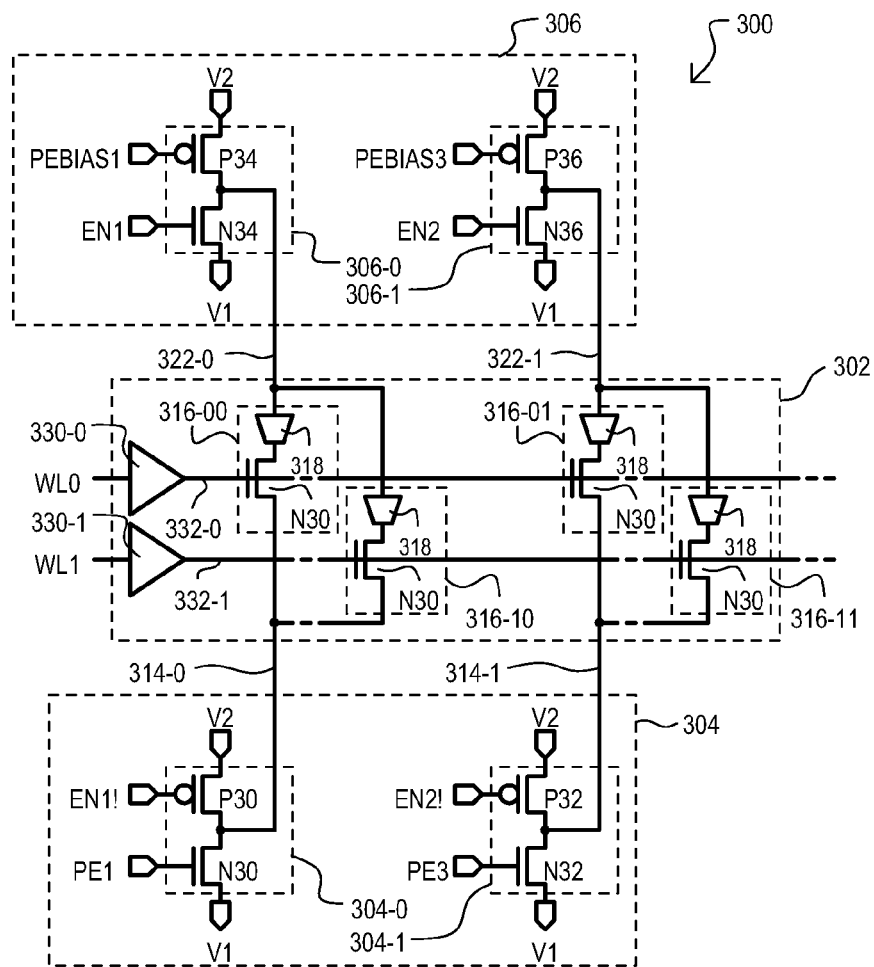
FIG. 3A is a block schematic diagram of a memory device according to a third embodiment.

Referring to FIG. 3A, a memory device according to yet another embodiment is shown in a block schematic diagram and designated by the general reference character 300. In one example, the memory device 300 can be one implementation of the embodiments shown in FIGS. 1 and/or 2. FIG. 3A shows a memory device 300 that can include features like those of FIG. 2. Such like features are referred to with a same reference character but with the first digit being a "3" instead of a "2".

FIG. 3A can be similar to memory device shown in FIG. 2. However, unlike the arrangement of FIG. 2, when a bit line and the corresponding source strap are de-selected, they can be placed in a high impedance state. It is understood that read circuitry (not shown in FIG. 3A) can be provided to read data values from selected bit lines.

The arrangement of FIG. 3A shows source line selection circuitry 304 formed with complementary MOS circuits, including source selection circuits 304-0 and 304-1. Source selection circuit 304-0 can include a p-channel transistor P30 and n-channel transistor N30. Transistor P30 can have a source-drain connected between a high voltage V2 and source strap 314-0, and receive an enable signal EN1! at its gate. Transistor N30 can have a source-drain path connected between source strap 314-0 and a low voltage V1, and receive a program enable signal PE1 at its gate. Source selection circuit 304-1 can have the same general structure as 304-0, but receive signals EN2! and PE3 at gates of transistors P32 and N32, respectively.

In a program operation, the program enable signal (PE1 or PE3) of a selected source strap can be driven high, while the corresponding enable signal (EN1! or EN2!) is also being driven high. As a result, the selected source strap can be driven to V1 and isolated from V2. In contrast, the program enable signal (PE1 or PE3) of a de-selected source strap can be driven low, while the corresponding enable signal (EN1! or EN2!) is driven high. As a result, the de-selected source strap can be isolated from both V2 and V1, thus placing the de-selected source strap into a high impedance state.

In an erase operation, the program enable signal (PE1 or PE3) of a selected source strap can be driven low, while the corresponding enable signal (EN1! or EN2!) can be driven low. As a result, the selected source strap can be driven to V2 and isolated from V1. De-selection can occur in the same fashion as the program operation (e.g., force the end of the source strap to be a high impedance).

FIG. 3A can also differ from that of FIG. 2 in that bit line selection circuitry 306 can have but one layer, and is also formed with complementary MOS circuits, including bit line selection circuits 306-0 and 306-1. Bit line selection circuits (306-0 and 306-1) can have the same structure as source line selection circuits. For example, bit line selection circuit 306-0 can include a p-channel transistor P34 and n-channel transistor N34 having source-drain paths in series between V2 and V1, and drains commonly connected to bit line 322-0. A program bias signal PEBIAS1 can be applied to a gate of P34, while an enable signal EN1 can be applied to a gate of N34.

In a program operation, the program bias signal (PEBIAS1 or PEBIAS3) of a selected bit line can be driven low, while the corresponding enable signal (EN1 or EN2) is also driven low. As a result, the selected bit line can be driven to V2 and isolated from V1. In contrast, a de-selected bit line can be placed in a high impedance state in the same fashion as a source strap (i.e., the program bias signal (PEBIAS1 or PEBIAS3) of a de-selected source strap can be driven high while the corresponding enable signal (EN1 or EN2) is driven low).

In an erase operation, the program bias signal (PEBIAS1 or PEBIAS3) of a selected bit line can be driven high, while the corresponding enable signal (EN1 or EN2) is also driven high. As a result, the selected bit line can be driven to V1 and isolated from V2. De-selection can occur in the same fashion as the program operation.

Figure 3B:
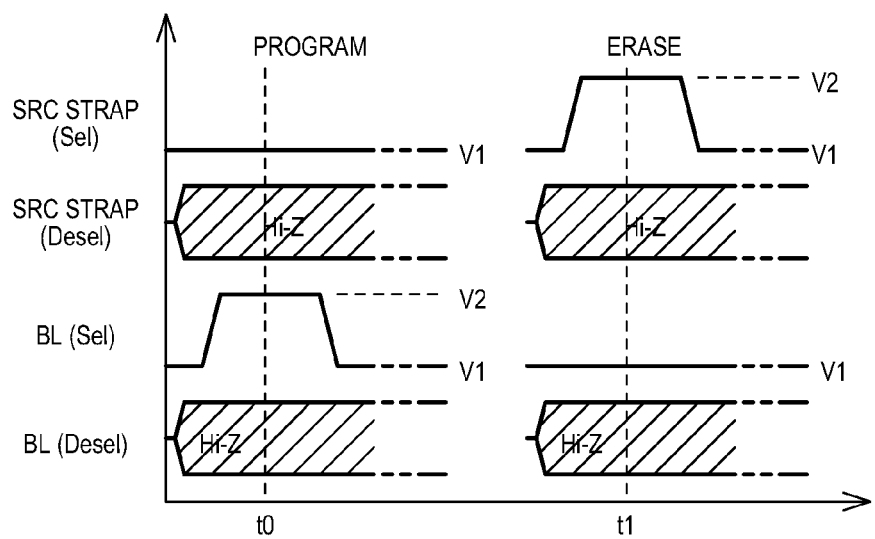
FIG. 3B is a timing diagram showing program and erase operations for an embodiment like that of FIG. 3A.

FIG. 3B is a timing diagram showing the operation of an embodiment like that of FIG. 3A. FIG. 3B includes waveforms for a selected source strap (SRC STRAP (Sel)), a de-selected source strap (SRC STRAP (Desel)), a selected bit line (BL (Sel)), and a de-selected bit line (BL (Desel)).

At time t0, a memory device may be undergoing a program operation. In such a programming operation, a selected source strap (SRC STRAP (Sel)) may be driven to a voltage V1, while a selected bit line (BL (Sel)) may be driven to a voltage V2. Consequently, a voltage (from bit line to source strap) of V2−V1 may be applied across a selected memory cell. At the same time, a de-selected source strap (SRC STRAP (Desel)) as well as a de-selected bit line (BL (Desel)) may be placed into a high impedance state (Hi-Z). Consequently, with respect to a corresponding bit line and source strap, a de-selected memory cell will be exposed to a high impedance.

At time t1, a memory device may be undergoing an erase operation. In such an erase operation, a selected source strap (SRC STRAP (Sel)) may be driven to a voltage V2, while a selected bit line (BL (Sel)) may be driven to a voltage V1. Consequently, a voltage (from bit line to source strap) of V1−V2 may be applied across a selected memory cell. At the same time, as in the case of a program operation, with respect to a corresponding bit line and source strap, a de-selected memory cell will be exposed to a high impedance.

In this way, a PMC memory device can include bit lines connected to anodes in a "floating" de-selection architecture. When bit line/source straps are de-selected, they can be left floating (electrically isolated from any particular potential, such as a program or erase potential).

Figures 4A, 4B:
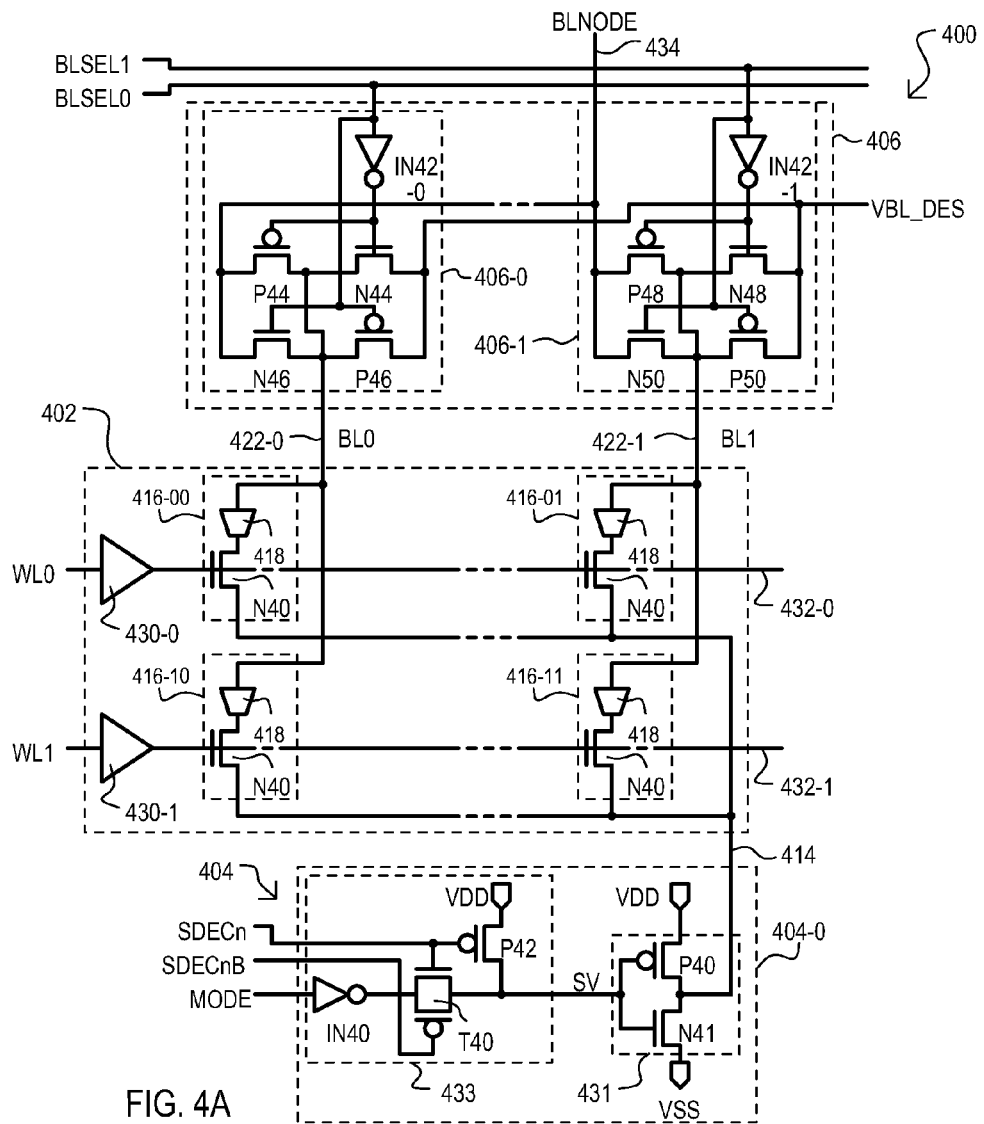
FIG. 4A is a block schematic diagram of a memory device according to a fourth embodiment.
FIG. 4B is a timing diagram showing program and erase operations for an embodiment like that of FIG. 4A.

Referring to FIG. 4A, a memory device according to yet another embodiment is shown in a block schematic diagram and designated by the general reference character 400. In one example, the memory device 400 can be one implementation of the embodiments shown in FIGS. 1 and/or 2. FIG. 4A shows a memory device 400 that can include features like those of FIG. 2. Such like features are referred to with a same reference character but with the first digit being a "4" instead of a "2".

FIG. 4A can be similar to memory device shown in FIG. 3A. However, unlike the arrangement of FIG. 3A, when a bit line and the corresponding source strap are de-selected, they are not placed in a high impedance state, but instead are driven to predetermined de-select potentials. In addition, FIG. 4A shows an arrangement in which a source line can be shared along a row direction in addition to a column direction.

FIG. 4A shows source line selection circuitry 404 with one source selection circuit 404-0. However it is understood that circuit 404-0 can be repeated for each selectable source strap. Source selection circuit 404-0 can include a source driver 431 and a source voltage selection circuit 433. A source driver 431 can have a CMOS inverter configuration, allowing it to drive source strap 414 to VDD or VSS. A source voltage selection circuit 433 can generate a source voltage signal SV for input into source driver 431. In the particular example of FIG. 4A, source voltage selection circuit 433 can include a de-select device P42, a passgate T40, and an inverter 140. De-select device P42 can be a PMOS device having a source-drain path connected between a supply voltage VDD and an input to source driver 431, and a gate connected to receive source decode signal SDECn. Passgate T40 can receive a mode signal MODE via inverter IN40, and can be enabled by source decode signal SDECn and its inverse SDECnB.

In operation, when a source strap is selected, signals SDECn can be high and SDECnB can be low. As a result, passgate T40 can be enabled, and signal MODE can be applied as an input SV to source driver 431. Thus, in the event signal MODE is high, signal SV will be low, and source strap 414 can be driven to a high power supply voltage VDD.

Conversely, if mode signal MODE is low, signal SV will be high, and source strap 414 can be driven to a low power supply voltage VSS. When a source strap is de-selected, SDECn can be low and SDECnB can be high. As a result, passgate T40 can be disabled, isolating source driver 431 from signal MODE. However, a low signal SDECn can enable de-select device P42, forcing signal SV high. As a result, source driver 410 drives source strap 414 to a de-select voltage, which in this case is VSS.

FIG. 4A also shows bit line selection circuitry 406 with two bit line selection circuits 406-0 and 406-1. Each such selection circuit (406-0 and 406-1) can have the same general structure, so only selection circuit 406-0 will be described in detail. Selection circuit 406-0 can include p-channel transistors P44, P46 and n-channel transistors N44, N46. Transistors P44 and N44 are arranged in a CMOS inverter configuration, having source-drain paths in series between a select bit line node 434 and a bit line de-selection voltage VBL_DES. Transistors P46 and N46 are also arranged in a CMOS inverter configuration, with source drain paths arranged in the opposite direction between a bit line node 434 and a bit line de-selection voltage VBL_DES. Bit line selection signal BLSEL0 can be applied directly to gates of transistors P46/N46, and by way of inverter IN42-0 to gates of transistors P44/N44.

In operation, when bit line select signal BSEL0 is active (in this case high), bit line 422-0 can be connected to select bit line node 434 by both transistors N46 and P44, and isolated from bit line de-select voltage VBL_DES. In contrast, when bit line select signal BSEL0 is inactive (in this case low), bit line 422-0 can be connected to bit line de-selection voltage VBL_DES by both transistors N44 and P46.

While programming and erase voltages are shown to be VDD and VSS, alternate embodiments can use voltages other than power supply voltage for such program and/or erase operations. Similarly, while a source de-select voltage of FIG. 4A is VSS, such a voltage, may be some other voltage between supply voltages VDD and VSS. Similarly, a bit line de-select voltage VBL_DES may be VSS in some embodiments, or a voltage between VDD and VSS in other embodiments.

FIG. 4B is a timing diagram showing the operation of an embodiment like that of FIG. 4A. FIG. 4B includes waveforms for a selected source strap (SRC STRAP (Sel)), a de-selected source strap (SRC STRAP (Desel)), a selected bit line (BL (Sel)), and a de-selected bit line (BL (Desel)).

At time t0, a memory device may be undergoing a program operation. In such a programming operation, a selected source strap (SRC STRAP (Sel)) may be driven to a low supply voltage VSS, while a selected bit line (BL (Sel)) may be driven to a high supply voltage VDD. At the same time, a de-selected source strap (SRC STRAP (Desel)) as well as a de-selected bit line (BL (Desel)) may be driven to de-select voltages, which in this particular embodiment, are both VSS.

At time t1, a memory device may be undergoing an erase operation. In such an erase operation, a selected source strap (SRC STRAP (Sel)) may be driven to a high power supply voltage VDD, while a selected bit line (BL (Sel)) may be driven to a low power supply voltage VSS. At the same time, as in the case of a program operation, a de-selected bit line and source strap may be driven to de-select voltages (VSS in this particular example).

The waveforms at time t2' show an alternate embodiment in which a deselect voltage Vdesel' may be some intermediate voltage between VDD and VSS (as opposed to VSS). In such an arrangement, a deselected bit line and source strap may both be driven to Vdesel'.

In this way, a PMC memory device can include bit lines connected to anodes in a "forced" voltage de-selection architecture. When bit line/source straps are deselected, they are driven to predetermined potentials which may result in zero volts across a deselected PMC.

Referring to FIG. 5, one particular example of a PMC memory array according to an embodiment is shown in a block schematic diagram and designated by the general reference character 500. PMC memory array 500 includes memory cells 516-00 to 516-3($n$+1) that each include a PMC 518 and access device 536. Memory cells of a same column can be commonly connected to a bit line 522-0 to 522-($n$+1) and to a particular source strap 514-0 to 514-($n$+1). In the arrangement shown, source straps (514-0 to 514-($n$+1)) can be commonly connected to decoded source nodes 538-0 to 538-$j$. Bit lines (522-0 to 522-($n$+1)) and source nodes (538-0 to 538-$j$) can be decoded according to any to the approaches shown above, or equivalents.

FIG. 5 shows but one example of a bit line anode architecture, and should not be construed and unduly limiting the invention to such a configuration.

In this way, a PMC array can include decoded anodes and decoded access device paths.

Referring to FIGS. 6A to 6E, alternative memory cell configurations that can be included in the embodiments are shown in schematic diagrams. The various embodiments utilize different types of access devices. FIGS. 6A and 6B show memory cells with an npn bipolar transistor and n-channel JFET as access devices. FIGS. 6C to 6E show memory cells with a p-channel MOS transistor, pnp bipolar transistor, and p-channel JFET as access devices, respectively. Such arrangements can be included in bit line-anode and decoded source (or emitter) architecture, like those shown above.

In this way, memory cells of a PMC memory device according to the embodiments can take various forms having different types of access devices.

Figures 0, 7A:
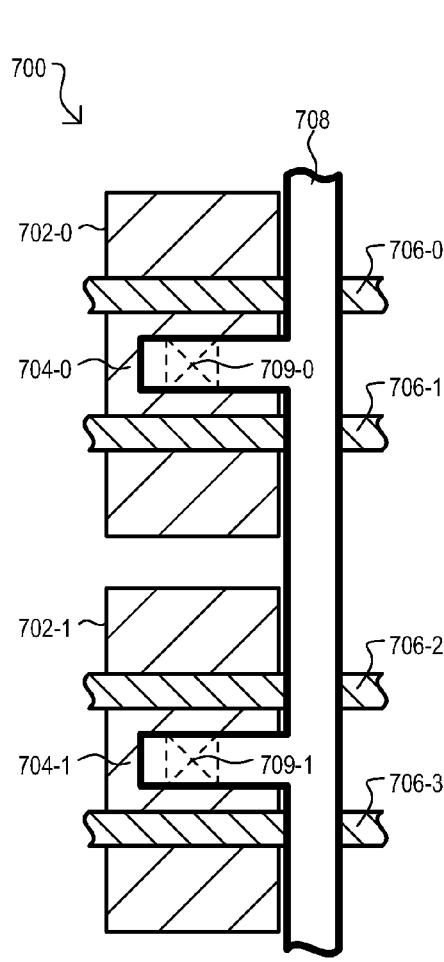
Figures 0, 7B:
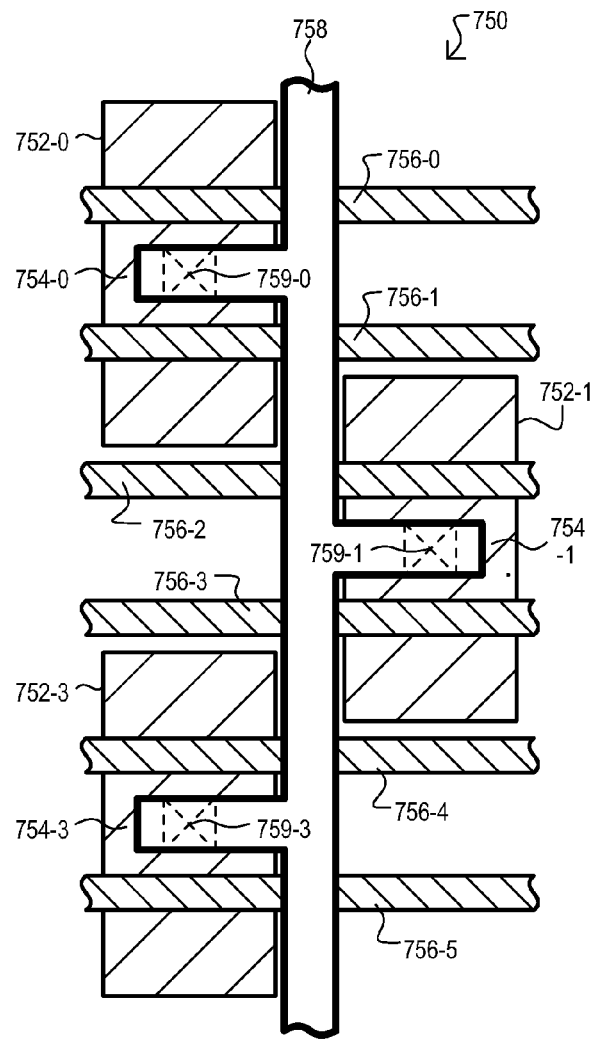
Figures 0, 7C:
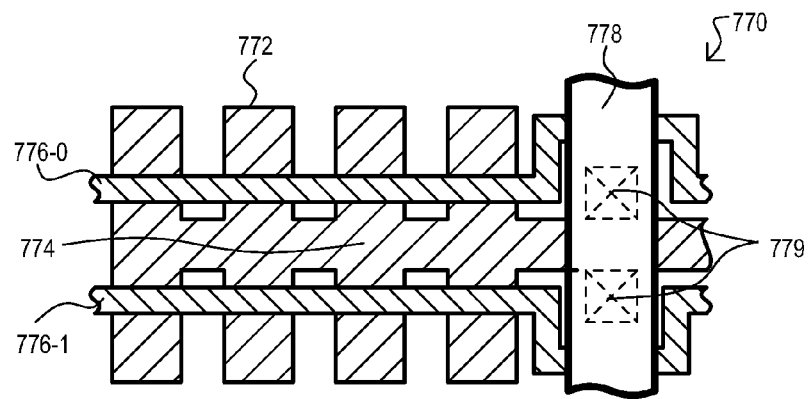

Referring to FIGS. 7A-0 to 7C-0, very particular examples of source strapping are shown in a series of top plan views. FIGS. 7A-0 shows a top plan view of a portion of an integrated circuit 700 that includes active areas 702-0 and 702-1, in which can be formed two MOS transistors having a common source region 704-0 and 704-1. In FIGS. 7A-0, access devices can be MOS transistors, thus gate structures 706-0 to 706-3 are shown that can form word lines of a PMC memory array. A patterned metallization layer can form a source strap 708. As shown, a source strap 708 can provide a conductive connection between common source regions (704-0 and 704-1) at contact locations 709-0 and 709-1. In a preferred embodiment, PMCs can be formed on higher layers, and make conductive connection to drain regions within the active areas 702-0 and 702-1.

Referring to FIGS. 7B-0, a source strapping arrangement for an integrated circuit 750 according to another embodiment is shown in a top plan view. Integrated circuit 750 includes some of the same general features as FIGS. 7A-0, so like features are shown by the same reference characters, but with the first two digits being "75" instead of "70". FIGS. 7B-0 can differ from that of FIGS. 7A-0, in that a source strap 758 can contact commons source regions 754-0/2 on opposing sides. That is, source strap 758 may contact active regions 754-0 and 754-3 on one side, as well as active region 754-1 on an opposing side.

Referring to FIGS. 7C-0, yet another source strapping arrangement for an integrated circuit 770 is shown in a top plan view. Integrated circuit 770 includes some of the same general features as FIGS. 7A-0, so like features are shown by the same reference characters, but with the first two digits being "77" instead of "70". FIGS. 7C-0 can differ from that of FIGS. 7A-0, in that a source strap 778 can contact a source region 774 common to a row of memory cells.

In FIGS. 7C-0, one active area 772 can form a basis for eight memory cells, and can include common source region 774 that extends in a row direction to a source strap 778. Such an arrangement can be symmetric about the source strap 778 (i.e., another eight memory cells can extend on the right hand side in FIGS. 7C-0).

Referring now to FIGS. 7A-1 to 7C-1, the same views of FIGS. 7A-0 to 7C-0 are shown, but also show how a bit line can be formed in contact with the access MOS transistors.

In particular, FIGS. 7A-1 shows how a bit line 703 can contact a drain of a MOS transistor at a bit line contact (one shown as 703-0) to thereby connect PMC cathodes (one shown as 703-1 and distinguished by hashing) to the MOS transistor. An ion conductor can be formed over each cathode, and an anode can be formed over such an ion conductor to form all or a portion of bit line 703. That is, bit line 703 can include a contiguous common anode, or can include separate anodes formed over the ion conductors of each PMC, where such anodes are conductively connected to one another by some other metallization layer. It is understood that cathode 703-1 can make conductive connection to a drain through various intervening structures including a "via" and/or "landing" formed by a metallization layer below that anode layer.

FIGS. 7B-1 shows a similar arrangement with bit line 753 having cathodes (one shown as 753-1) connected to pass devices at bit line contact 753-0.

FIGS. 7C-1 shows a similar arrangement, illustrating one bit lines (one shown as 773) having cathodes (one shown as 773-1) connected to pass devices at bit line contacts (one shown as 753-0). FIGS. 7C-1 illustrates how compactness of an array structure can be achieved with a common source that extends in the row direction.

In this way, a memory device may have source strap layers formed from a metallization layer that include portions parallel to bit lines.

FIGS. 8A and 8B are side cross sectional views showing two particular embodiments showing PMCs in bit line anode arrangements. FIG. 8A shows PMCs 802-0 and 802-1. Each includes a cathode 804-0/1 connected to a pass device of a memory cell (not shown) by an intervening via 806-0/1. An ion conductor 808-0/1 can be formed on each cathode 804-0/1. A common anode 810 can be formed over such ion conductors 808-0/1 and thus form a bit line, or portion of a bit line. FIG. 8B shows a similar arrangement. However, each PMC 832-0/1 can include its own anode 840-0/1 in conductive contact with an overlying bit line metallization 842.

In this way, a bit line anode embodiment may include anode integral to a bit line structure, or separate from a bit line structure.

Referring now to FIG. 9, a memory device 900 according to another embodiment is shown in a schematic layout diagram. A memory device 900 may include memory cells 916, bit lines (one shown as 922), source straps (one shown as 914), bit line selection circuitry 906, or source selection circuitry 904.

Memory cells 916 may include an access device 936 and a variable impedance element 918. Variable impedance storage elements (elements) 918, may be directly connected to a bit line 922, and connected to a source strap 914 through a corresponding access device 936. Elements 918 may be PMCs in one embodiment. Memory cells 916 may be controlled by corresponding word lines WL0 to WLm.

Bit line selection circuitry 906 can selectively apply predetermined voltages to a bit line 922 according to mode (e.g., program, erase, read). Similarly, source line selection circuitry 904 can selectively apply predetermined voltages to a source strap 914 according to mode.

FIG. 9 shows that a bit line 922 may be disposed in a first direction (X-DIR), while word lines (WL0 to WLm) may be disposed in a second direction (Y-DIR) different from the first direction. In addition, source strap 914 may be disposed in the same direction as bit line 922 (X-DIR), not the same direction as a word line (WL0 to WLm).

In this way, a memory device having memory cells with access devices and variable impedance elements may include bit lines directly connected to the variable impedance elements, and source strap lines connected to access devices that are parallel to the bit lines.

Referring now to FIGS. 10A to 10C, word line driver circuits that may be included in an embodiment are shown in block schematic diagrams and a timing diagram.

In some embodiments, an access device within a memory cell may limit a voltage presented across a given storage element (i.e., PMC). As but one example, an access device transistor (e.g., MOS transistor) may provide a low impedance path only after a gate voltage exceeds a threshold voltage. Such an access device threshold voltage may limit a voltage applied to a storage element in one mode (e.g., erase), but not in another mode (e.g., program). According to one embodiment, word line driver circuits may drive control terminals (e.g., gates) of access devices to provide symmetrical voltages across a storage element in both program and erase modes.

Referring to FIG. 10A, a word line driver circuit that may be included in the embodiments is shown in a block schematic diagram, and designated by the general reference character 1000-A. A word line driver circuit 1000-A may receive voltages V2 and V1, as well as a word line select signal WLSELx. In response to signal WLSELx (and optionally other timing signals, such as a clock signal), a word line driver circuit 1000-A may include a driver 1002 that drives a word line 1032-A between a voltage range greater than its received power supply voltage range (i.e., greater than V2-V1). In the very particular example of FIG. 10A, word line driver 1002 may drive a word line 1032-A connected to gates of n-channel MOS access transistors (not shown). A voltage V2 may be a high supply voltage, a voltage V1 may be a low supply voltage.

Word line 1032-A may be driven between V1 and Vboost, which is greater than V2. More particularly, Vboost may be greater than V2 by at least a threshold voltage of the access devices connected to word line 1032-A.

In one embodiment, driver 1002 may be "self-boosting". That is, a word line driver 1002 may incorporate boosting circuitry for generating voltage Vboost. As but one very particular example, a word line driver 1002 may have a capacitor with a first terminal connected to a V2 and a second terminal connected to V1 prior to an access operation. During the access operation, the first terminal may be connected to the word line 1032-A, while the second terminal is connected to V2.

Referring to FIG. 10B, another word line driver circuit that may be included in the embodiments is shown in a block schematic diagram, and designated by the general reference character 1000-B. A word line driver circuit 1000-B may include a number of drivers 1002-0' to 1002-x' that each drive a corresponding word line 1032-B0 to 1032-Bx in response to word line select signals WLSEL0 to WLSELx. As in the case of FIG. 10A, drivers (1002-0' to 1002-x') may drive word lines (1032-B0 to 1032-Bx) between V1 and Vboost, where V1 is a low power supply, and Vboost is higher than a high power supply V2.

Unlike the arrangement of FIG. 10A, in word line driver circuit 1000-B drivers (1002-0' to 1002-x') are not "self-boosting". Instead, each driver (1002-0' to 1002-x') may receive a low power supply voltage V1 and a boost voltage Vboost at a boost terminal 1060. A boost terminal 1060 may be connected to a charge pump circuit, or some other source of a voltage outside of a power supply range.

Referring to FIG. 10C, the operation of a memory device according to an embodiment is shown in a timing diagram. The timing diagram includes a waveform BL (Sel), which shows a voltage applied to a selected bit line, a word line voltage (WL), a voltage applied to a source strap (SRC STRP), and a voltage received by an element (e.g., PMC) (ELEMENT). In the example of FIG. 10C, it is assumed that a memory device includes n-channel MOS access devices with a threshold voltage Vth (access).

At time t0, a memory device may be undergoing a program operation. In such a programming operation, a selected source strap (SRC STRAP (Sel)) may be driven to a voltage V1, while a selected bit line (BL (Sel)) may be driven to a voltage V2. A word line may be driven to a voltage V2. Because an n-channel MOS access device "pulls-down" to V1 in this arrangement, no threshold drop is introduced and terminals of an element receive voltage V2 and V1. Consequently, a voltage of V2−V1 may be applied across a selected element.

At time t1, a memory device may be undergoing an erase operation. In such an erase operation, a selected source strap (SRC STRAP (Sel)) may be driven to a voltage V2, while a selected bit line (BL (Sel)) may be driven to a voltage V1. Because an n-channel MOS access device "pulls-up" to V2, it could introduce a threshold voltage drop. However, a word line may be driven to a voltage Vboost, which is greater than or equal to V2+Vth (access). Such a boosted voltage may ensure no threshold voltage drop is introduced. Consequently, a voltage of V1−V2 may be applied across a selected element. Waveform ELEMENT includes a dashed line to show a voltage that may be applied if a word line was driven only to V2.

While FIGS. 10A to 10C have shown an arrangement in which a high boosted voltage may be utilized in conjunction with n-channel MOS transistors, other embodiments may include different boosting for different types of access devices.

In this way, a memory device may include word line boosting circuits to overcome voltage drops inherent in memory cell access devices to provide a same voltage across an element in both program and erase operations.

Other embodiments show circuits and methods for erasing selected PMCs of a PMC memory array. Such embodiments can advantageously erase and verify selected PMC(s) in a single operation, as opposed to erasing a PMC and then subsequently reading from the PMC device to ensure that it has been adequately erased.

Referring now to FIG. 11, a memory device according to an embodiment is shown in block schematic diagram and designated by the general reference character 1100. A memory device 1100 can include a PMC memory array 1102, a row decoder 1104, a bit line select circuit 1106, bit line decoder 1108, and erase and verify circuits 1110.

A PMC array 1102 can include a number of memory cells arranged into multiple columns and rows. Generally, a PMC may have a structure like that described above in conjunction with FIG. 1, or equivalents.

FIG. 11 shows two possible examples of PMC memory array configurations that can be included in a PMC memory array 1102. Such examples of memory array configuration are shown as items 1114-A and 1114-B. Array configuration 1114-A shows a "common anode" configuration. Each memory cell can include PMCs 1115 with anodes connected to a common anode node 1124. In addition, each PMC 1115 can be connected to a bit line 1120 by an access device 1118, which in this case can be an n-channel MOS transistor. In response to a voltage on a word line 1122 a PMC cathode can be connected to a corresponding bit line 1120.

Array configuration 1114-B shows a "common cathode" configuration, which can generally follow the configuration of 1114-A, but includes PMCs with cathodes connected to a common cathode node 1124', and access devices formed by p-channel MOS transistors. However, other embodiments can include various different array configurations.

Row decoder 1104 can activate word lines in response to address data. Similarly, bit line decoder 1108 can activate bit line select signals in response to address data. Bit line select circuit 1106 can connect selected bit lines to erase/verify circuit 1110 in response to bit line select signals.

Erase and verify circuits 1110 can include a number of erase and verify sections 1112-0 to 1112-n that can each erase and verify a selected PMC (or PMCs) in a single operation. Such approaches can supply a voltage to a selected PMC(s) based on current drawn by such PMC(s).

Such a single erase/verify approach may be in contrast to conventional approaches that can "blindly" apply voltages across PMCs based on previous characterization of PMCs. In such conventional approaches, erase pulse voltage and duration can be selected in an attempt to guarantee erasure over all anticipated variations in PMC response. Consequently, such pulses may represent a longest erasure time (i.e., a worst case PMC erase case). Further, to verify erase has been achieved, erased cells are typically read to ensure that they are erased. All of these factors can disadvantageously increase overall erase time. Further, conventional PMC erase approaches can result in "over erased" cells, as an erase characterization for one PMC (or group of PMCs), may result in over-erasure in another PMC (or group of PMCs). Still further, placing PMCs under erase bias conditions longer than those necessary to achieve a target impedance can reduce the endurance of the PMCs.

The erase verify circuits of the present embodiments are also in contrast to "algorithmic" approaches. Such algorithmic approaches can apply multiple erase and read pulses. After each read, erase conditions can be adjusted to make a next applied erase pulse more efficient. Such approaches can require logic for executing such algorithms, which can disadvantageously consume area on an integrated circuit.

Referring to FIG. 12, an erase and verify section according to one embodiment is shown in a block schematic diagram, and designated by the reference character 1200. Erase and verify section 1200 is shown connected to a PMC memory array 1202. In one example, an erase and verify section 1200 can be one implementation of those shown as 1112-0 to 1112-n in FIG. 11, and PMC memory array 1202 can be any of those implementations shown as 1102 in FIG. 11.

Erase and verify section 1200 can include a transconductance section 1226, an amplifier 1228, and a signal generator 1230. A transconductance section 1226 can provide a current "I" in response to an output voltage VOUT. Current "I" can be either into or out of PMC memory array 1202 depending upon the array configuration.

Amplifier 1228 can have one input that receives an erase reference voltage VERC, another input that receives an array voltage Varray, and an output that provides output voltage VOUT. Signal generator 1230 can provide an erase verify signal ER_VER in response to output voltage VOUT.

Prior to an erase operation, a selected PMC(s) within PMC memory array 1202 can have a particular impedance. During an erase operation, erase and verify section 1200 can be connected to such a PMC(s). This can establish an initial Varray value based on the initial impedance of the selected PMC(s). Due to a difference between voltage Varray and erase reference voltage VERC, transconductance section 1226 can enable a path between voltage V1 and V2 that results in an erase potential being applied across the PMC(s), and thus can start an erase operation.

In response to being placed between voltages V1 and V2 (i.e., an erase potential), an impedance presented by the PMC(s) can change, resulting in Varray changing (more toward VERC). This, in turn, can cause and output of amplifier 1228 to change, causing transconductance section 1226 to provide less current.

A signal generator 1230 can detect the change in the output of amplifier 1228 to activate an erase verification signal ER_VER. A threshold for such a determination can correspond to a voltage generated by accessed PMCs being in a fully erased state. In this way, easer verification signal ER_VER can indicate when a selected PMC(s) is erased.

An approach like that shown above can eliminate a need for a read cycle following an erase cycle to verify that erasure has occurred. Avoiding a follow-on read operation can lead to lower power consumption, and/or provide for a reduction in device size as algorithms for executing relatively complex multi-cycle erase and verify operations can be omitted. Further, a time between the application or erase potentials to the PMC(s) and the activation of the erase verification signal ER_VER can help characterize an erase time for a device.

An approach like that above may also provide for more efficient erasure of PMC devices. By basing erasure of a PMC(s) on a final impedance value, a chance of under erasing (not placing a PMC into a high enough impedance state), can be reduced. Further, faster erase times may be achieved, as an erase time for a PMC(s) can be based on the properties of that particular PMC(s), rather than a worst case (i.e., longest erase time) PMC. Along these same lines, because erasure is based on a final resistance value, control over final PMC resistance values can be better than other approaches that base erasure on worst case devices. Such features can also reduce or eliminate the incidence of over erase in a PMC and/or increase the endurance of a PMC, as a PMC (or group of PMCs) is subject to erase bias conditions only as long as is necessary to achieve a targeted impedance.

Still further, in standard read operations, that can occur at lower voltages than an erase operation, it may be difficult to read from such a high impedance device as an erased PMC. In contrast, an approach like the embodiments herein can provide a reading (i.e., verifying) of such a high impedance state with an erase operation, taking advantage of the existing high voltage states. This can eliminate the need for lower voltage high resistance follow on reads to determine a PMC erased state.

In this way, a PMC memory device can include circuits that simultaneously erase and then verify the erasure of one or more selected PMCs.

Referring now to FIG. 13, an erase and verify section according to another embodiment is shown in a block schematic diagram, and designated by the reference character 1300. In one example, an erase and verify section 1300 can be one implementation of those shown as 1112-0 to 1112-*n* in FIG. 11 and/or that shown in FIG. 12. FIG. 13 shows a memory device 1300 that can include features like those of FIG. 12. Such like features are referred to with a same reference character but with the first digits being "13" instead of a "12".

The arrangement of FIG. 13 shows an arrangement like that of FIG. 12 with PMC array 1302 having a common cathode architecture. A selected bit line can be connected to erase and verify section 1300 at a common node 1332.

Within erase and verify section 1300, an amplifier 1328 can be an operational amplifier having a (+) input connected to a erase reference voltage VERC_CAT and a (−) input connected to a common node 1332. A voltage VERC_CAT can be a positive voltage with respect to a low power supply voltage VSS.

A transconductance section 1326 can include an n-channel MOS (NMOS) transistor N30 having a drain connected to common node 1332, a source connected to a low power supply voltage VSS, and a gate connected to an output of amplifier 1328.

A signal generator 1330 can include comparator 1334, a verify reference current source 1336, and a load device (in this case "diode" connected NMOS device N32). Comparator 1334 can have a (−) input connected to an output of amplifier 1328, a (+) input connected to gate-drain connection of N32, and an output that provides an erase verify signal ER_VER. Current source 1336 can be connected between a drain of N32 and a high power supply voltage VDD, and can provide a verify reference current into load device N32. In such an arrangement, during an initial portion of an erase operation, an impedance of a selected PMC(s) is sufficiently small that an output of amplifier 1328 drives comparator 1334 input (−) higher than a voltage presented at input (+) according to current source 1336 and N32. As a result, comparator 1334 output can be low, signifying non-erasure. However, once the selected PMC(s) are erased to a predetermined higher impedance, a potential at the output of amplifier 1328 can fall, comparator input (−) to be lower than a voltage presented at input (+). As a result, comparator 1334 output can go high, signifying that erasure has been successful.

In this way, a common cathode architecture can erase and verify PMC(s) in a single operation.

Figure 14:
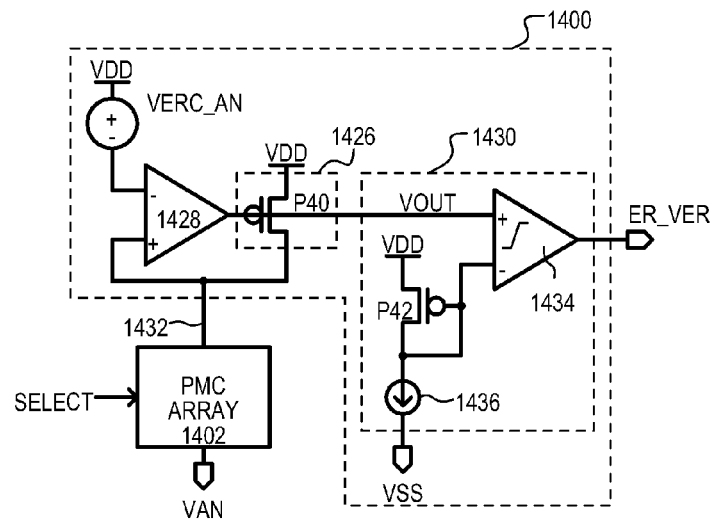
FIG. 14 is a block schematic diagram showing an erase and verify circuit section according to another embodiment.

Referring now to FIG. 14, an erase and verify section according to another embodiment is shown in a block schematic diagram, and designated by the reference character 1400. This example can also be one version of that shown as 1112-0 to 1112-*n* in FIG. 11 and/or that shown in FIG. 12. FIG. 14 shows a memory device 1400 that can include features like those of FIG. 13. Such like features are referred to with a same reference character but with the first digits being "14" instead of a "13".

The arrangement of FIG. 14 can differ from that of FIG. 13 in that PMC array 1402 can have a common anode architecture. As a result, within erase and verify section 1400, an amplifier 1428 can have a (−) input connected to an erase reference voltage VERC_AN (which can be negative with respect to a high supply voltage VDD), a (+) input connected to a common node 1432. In addition, a transconductance section 1426 can include a p-channel MOS (PMOS) device P40. Still further, a signal generator 1430 can include a comparator 1434 with a (+) input connected to an output of amplifier 1428, a (−) input connected to a load PMOS P42, and an output that provides an erase verify signal ER_VER. A current source 1436 can sink current from load device P42.

In a similar fashion as the embodiment of FIG. 13, in an initial portion of an erase operation, an impedance of a selected PMC(s) is sufficiently small that an output of amplifier drives comparator 1434 input (+) lower than that presented at input (−). As a result comparator 1434 output can be low, signifying non-erasure. However, once the selected PMC(s) are erased to a predetermined higher impedance, a potential at the output of amplifier 1428 can rise, causing comparator 1434 input (+) to be higher than a voltage presented at input (−). As a result comparator 1434 output can be high, providing a verification that erasure has been successful.

In this way, a common anode architecture can erase and verify PMC(s) in a single operation.

Figure 15A:
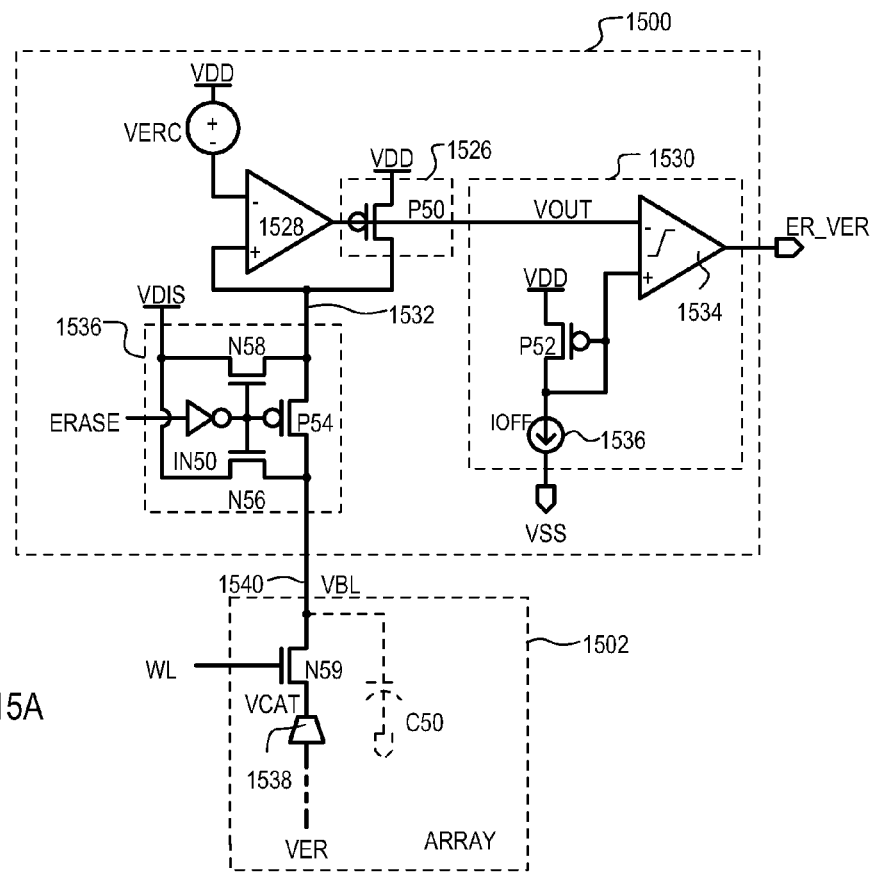
FIG. 15A is a block schematic diagram showing an erase and verify circuit section according to yet another embodiment.

Referring now to FIG. 15A, an erase and verify section according to yet another embodiment is shown in a block schematic diagram, and designated by the reference character 1500. This example can also be one version of that shown as 1112-0 to 1112-n in FIG. 11, and/or that shown in FIG. 12, and/or that shown in FIG. 14. FIG. 15A shows a memory device 1500 that can include features like those of FIG. 14. Such like features are referred to with a same reference character but with the first digits being "15" instead of "14".

The arrangement of FIG. 15A can differ from that of FIG. 14 in that an access to a PMC array is represented by an access transistor N59 and a PMC 1538 connected to a bit line 1540. A parasitic capacitance presented by a selected bit line location is represented by a capacitance C50.

In addition, erase and verify section 1500 can include an erase enable circuit 1536 that enables/disables a path between a selected bit line 1540 and common erase node 1532 according to an erase mode signal ERASE. In the particular example shown, when an erase mode signal ERASE is active (in this case high), bit line 1540 can be connected to common erase node 1532 by a low impedance path. In contrast, when erase mode signal ERASE is inactive (in this case low), bit line 1540 can be electrically isolated from common erase node 1532, and both bit line 1540 and common erase node 1532 can be connected to a disable voltage potential VDIS.

In the very particular example of FIG. 15A, erase enable circuit 1536 includes a PMOS enable transistor P54, first disable NMOS transistor N56, second disable NMOS transistor N58, and inverter IN50. Transistor P54 can have a source-drain path connected between a common erase node 1532 and bit line 1540, and a gate connected to an output of inverter IN50. Transistor N56 can have a source-drain path connected between bit line 1540 and disable potential VDIS, and a gate connected to an output of inverter IN50. Transistor N58 can have a source-drain path connected between common erase node 1532 and disable potential VDIS, and a gate connected to an output of inverter IN50.

When erase mode signal ERASE is active, P54 is enabled, while N56 and N58 are disabled. When erase mode signal ERASE is inactive, P54 is disabled while N56 and N58 are enabled.

Figure 15B:
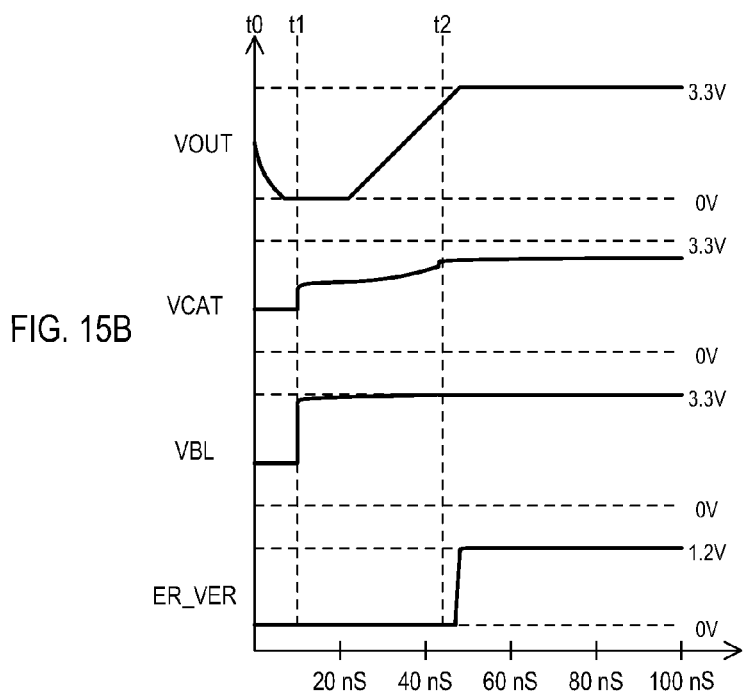
FIG. 15B is timing diagrams showing one example of an operation for the circuit shown in FIG. 15A.

One example of the operation of the embodiment shown in FIG. 15A is shown in FIG. 15B. FIG. 15B is a timing diagram that shows a waveform VOUT which can be an output voltage from amplifier 1528, a waveform VCAT which can be voltage at a cathode of PMC 1538, a waveform VBL which can be voltage at bit line 1540, and a waveform ER_VER which can be the erase verify signal ER_VER output from signal generator 1530.

Prior to time t0, a voltage at PMC cathode 1538, bit line 1540, and common erase node 1532 can be preset to a predetermined precharge voltage. A voltage VERC can be set to just below a supply voltage VDD. In one very particular example, a voltage VERC can be 3.2 volts, while VDD is 3.3 volts.

Starting at about time t0, erase enable circuit 1536 can be enabled. Because PMC 1538 is in a programmed, relatively low resistance state, amplifier 1528 can drive VOUT to its lowest level VSS (which in this case can be 0 V). Transistor P50 can be fully turned on, and thus pull bit line 1540 to a voltage VDD. This will start the erasure of the PMC 1538.

At about time t1, as the PMC 1538 erases, a cathode voltage VCAT and bit line voltage VBL can continue to rise. In response to the bit line voltage being greater than VERC, amplifier 1528 can drive VOUT high.

At about time t2, VOUT is sufficiently large enough to cause signal generator 1530 to activate the erase verify signal ER_VER. In particular embodiments, erase verify signal ER_VER can be used to end erase operations (e.g., disable PMOS 54 and/or otherwise isolate the erased PMC from erase node 1532).

It is noted that in one particular approach, transistor P52 can be a replica of transistor P50. A current IOFF provided by verify current source 1536 can provide a current of 0.1 μA. A voltage across the cell at the trip point can be 1.43 V giving a trip point resistance of about 14.3 MΩ.

While FIG. 15A shows an erase and verify circuit for use with a common anode type architecture, an alternate embodiment can be compatible with a common cathode arrangement, and thus follow the general configuration shown in FIG. 13.

In this way, an erase and verify section can provide a predetermined impedance point at which to trip (activate) an erase verify signal, and thus signify an end to an erase operation.

Figure 16:
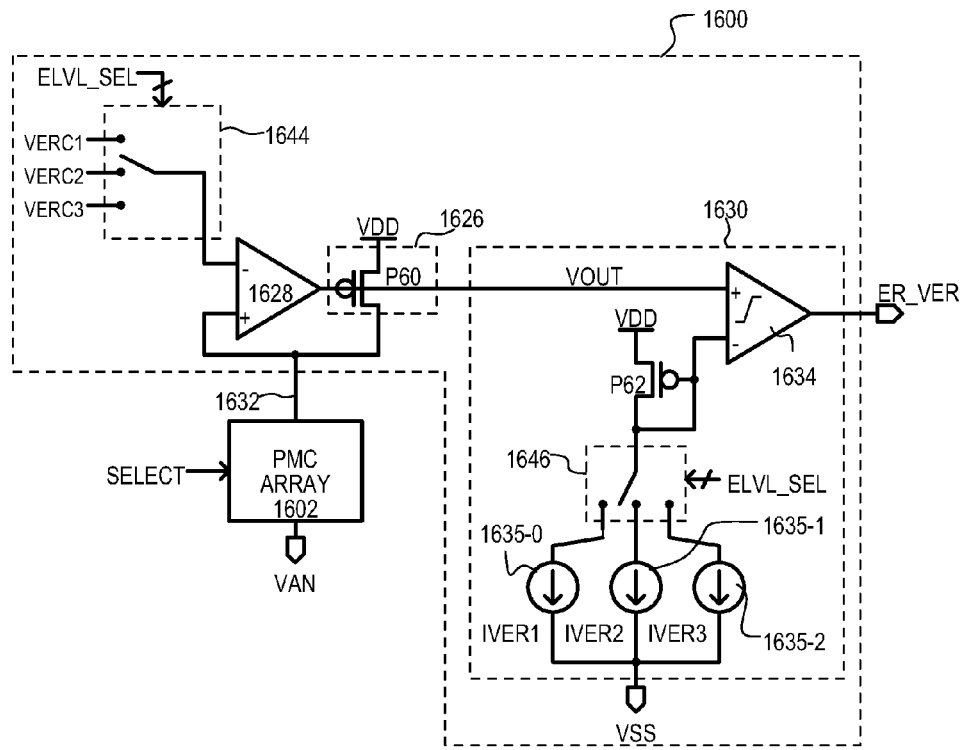
FIG. 16 is a block schematic diagram showing an erase and verify circuit section according to still a further embodiment.

Referring now to FIG. 16, an erase and verify section according to yet another embodiment is shown in a block schematic diagram, and designated by the general reference character 1600. This example can also be one version of that shown as 1112-0 to 1112-n in FIG. 11, and/or that shown in FIG. 12, and/or that shown in FIG. 14. FIG. 16 shows a memory device 1600 that can include features like those of FIG. 14. Such like features are referred to with a same reference character but with the first digits being "16" instead of "14".

The arrangement of FIG. 16 can differ from that of FIG. 14 in that an accessed PMC(s) can be erased to more than one impedance state. In the particular example of FIG. 16, an erase and verify circuit can include an erase voltage switch 1644, a verify reference switch 1646, and multiple verify current sources 1635-0 to 1635-2.

In response to erase level select values (ELVL_SEL), an erase voltage switch 1644 can connect an input (in this case the "−" input) of amplifier 1628 to one of three different erase reference voltages VERC1 to VERC3. Similarly, in response to the same values ELVL_SEL, verify reference switch 1646 can connect a different one of verify current sources (1635-0 to 1635-2) to load P62. In such an arrangement, an erase verify signal ER_VER can be tripped for different resulting cell resistance values, allowing erase operations to stop when a particular resistance is achieved.

In this way, an erase and verify section can erase and verify the erasure of a PMC memory cell at one of a number of different erase states.

It is understood that erase and verify circuits according to the various embodiments shown herein, and equivalents, can erase multiple PMC memory cells at a time. In such arrangements, reference values generated to determine when a desired impedance is achieved can reflect a resulting impedance of multiple PMC cells, or be scaled to represent an impedance of multiple PMC cells.

Embodiments of the invention may also include circuits and methods for programming selected PMCs of a PMC array. Such embodiments can advantageously program and verify selected PMC(s) in a single operation, as opposed to programming a PMC device and then subsequently reading from the PMC device to ensure that it is adequately programmed.

Referring now to FIG. 17, a memory device according to an embodiment is shown in block schematic diagram and designated by the general reference character 1700. A memory device 1700 can include a PMC memory array 1702, a row decoder 1704, a bit line select circuit 1706, bit line decoder 1708, and program and verify circuits 1710.

A PMC array 1702 can include a number of memory cells arranged into multiple columns and rows. Generally, a PMC may have a structure like that described above in conjunction with FIG. 1, or equivalents.

FIG. 17 shows two possible examples of PMC memory array configurations that can be included in a PMC memory array 1702. Such examples of memory array configuration are shown as items 1714-A and 1714-B, and may have the same general arrangement as items 1114-A and 1114-B, respectively, of FIG. 11.

Row decoder 1704 can activate word lines in response to address data. Similarly, bit line decoder 1708 can active bit line select signals in response to address data. Bit line select circuit 1706 can connect selected bit lines to program and verify circuit 1710 in response to bit line select signals.

Program and verify circuits 1710 can include a number of program and verify sections 1712-0 to 1712-$n$ that can each program and verify a selected PMC (or PMCs) in a single operation. Such circuits can provide a current to a selected PMC(s) to generate a voltage across the PMC. Such a voltage can be monitored, and once it varies from a program reference voltage, a program verify signal can be generated to thereby indicate that the PMC has been programmed.

Such an approach is in contrast to conventional approaches that apply voltages across PMCs based on PMC characterization. In such approaches, program voltage and pulse duration can be selected to attempt to guarantee the programming of a PMC over all expected variations. Consequently, in order to ensure sufficient margin to program all devices over such variation, program times may be set to a "worst" (i.e., longest) programming time. As a result, program times can be unnecessarily longer than needed. Further, to verify programming has been achieved, programmed cells are typically read to ensure that they have been programmed. This can increase overall program operation time.

The programming and verify circuits of the present embodiments are also in contrast to "algorithmic" approaches. Such algorithmic approaches can execute multiple program and read operations. After each read, programming conditions can be adjusted to make a next applied program pulse more efficient. Such approaches can require considerable logic for executing such an algorithm that can consume value integrated circuit area.

Referring to FIG. 18, a program and verify section according to one embodiment is shown in a block schematic diagram, and designated by the reference character 1800. Program and verify section 1800 is shown connected to a PMC memory array 1802. In one example, a program and verify section 1800 can be one implementation of those shown as 1712-0 to 1712-$n$ in FIG. 17, and PMC memory array 1802 can be any of those implementations shown as 1702 in FIG. 17.

In FIG. 18, a PMC memory array 1802 has a common cathode configuration. According to selection information SELECT, one or more PMC can be connected (in this case at their anode ends) to program node 1826.

Program and verify section 1800 can be connected between a high power supply node VDD and program node 1826. In the example shown, erase and verify section 1800 can include a program current source circuit 1828 and a verify signal generator 1830. A program current source circuit 1828 can supply a program current IPROG to program node 1826 in response to a program control value PROG. A current IPROG can be a constant current, or alternatively, can be a variable current.

According to an impedance across a selected PMC(s), a monitored voltage can be generated at program node. More particularly, prior to programming, non-programmed (or erased) PMCs can have a relatively high resistance. When current source circuit 1828 is initially enabled, a monitored voltage can be relatively high, due to such a high impedance state. However, enabling current source circuit 1828 can also generate a voltage that programs the selected PMC(s), resulting in a drop in impedance across a selected PMC(s). Consequently, after such elements are programmed, a voltage at program node 1826 can drop with respect to its initial value, indicating the programmed state. Operation of current source circuit 1828 in combination with a resulting impedance across selected can PMC(s) can serve to self-limit programming.

A verify signal generator 1830 can compare a voltage at program node 1826 to a program reference voltage VREF_CAT. In response to such a comparison, a program verify signal PR_VER can be activated. In the very particular example of FIG. 18, a verify signal generator 1830 can include a comparator having a (+) input connected to program reference voltage VREF_CAT, a (−) input connected to program node 1826, and an output that provides the program verify signal PR_VER. A program reference voltage VREF_CAT can be the voltage necessary to induce programming in a selected PMC(s) (i.e., a PMC threshold voltage, $Vt_{PMC}$), or can be greater than $Vt_{PMC}$.

A program verify signal PR_VER can be used to stop or inhibit a program operation. In particular, all or a portion of current source circuit 1828 can be disabled (stopped from providing current) when signal PR_VER is activated.

In this way, a PMC memory device can include circuits that simultaneously program and then verify the programming of one or more selected PMCs by enabling a current source to the selected PMCs and then monitoring a resulting generated voltage.

Referring now to FIG. 19, a program and verify section according to another embodiment is shown in a block schematic diagram, and designated by the general reference character 1900. As in the case of FIG. 18, in one example, a program and verify section 1900 can be one implementation of those shown as 1712-0 to 1712-$n$ in FIG. 17. FIG. 19 shows a memory device 1900 that can include features like those of FIG. 18. Such like features are referred to with a same reference character but with the first digits being "19" instead of "18".

The arrangement of FIG. 19 can differ from that of FIG. 18 in that PMC array 1902 can have a common anode architecture. Consequently, a program and erase section 1900 can be connected between a program node 1926 and a low power supply voltage VSS. Further, program current source circuit 1928 can sink current from PMC memory array 1902.

Referring still to FIG. 19, program verify signal generator 1930 is represented by a comparator having a (+) input connected to program node 1926, a (−) input connected to a reference voltage VREF_AN, and an output that provides the program verify signal PR_VER. In this arrangement, a difference between a common anode voltage and the reference voltage (VDD-VREF_AN) can be about $Vt_{PMC}$, or can be greater than $Vt_{PMC}$.

In this way, in a common anode architecture, a circuit can program and verify PMC(s) in a single operation.

Referring now to FIGS. 20A and 20B, a program and verify section according to yet another embodiment is shown in a block schematic diagram, and designated by the general reference character 2000. This example can also be one version of that shown as 1712-0 to 1712-n in FIG. 17. FIG. 20A shows a program and verify device 2000 that can include features like those of FIG. 18. Such like features are referred to with a same reference character but with the first digits being "20" instead of "18". FIG. 20B is a timing diagram showing one operation of the embodiment shown in FIG. 20A.

The arrangement of FIG. 20A can differ from that of FIGS. 3-2 in that a precharge circuit 2028-0 can be included in addition to a current source circuit 2028-1. A precharge circuit 2028-0 can allow for more voltage across a selected PMC(s), which can allow for a faster programming of such a PMC(s). According to a particular stage of a programming operation, the current source 2028-1 or precharge circuit 2028-0 can be enabled or disabled. In the particular example of FIG. 20A, a precharge circuit 2028-0 can be enabled in response to a signal PRCH, and current source 2028-1 can be enabled in response to a signal PROG_EN.

Referring to FIG. 20A in combination with 20B, one example of a program operation will be described. At about time t0, in response to signal PRCH, precharge circuit 2028-0 can be enabled to start a programming operation of a selected PMC(s). At this time, current source 2028-1 can be disabled, or alternatively enabled. When enabled, precharge circuit 2028-0 can connect program node 2026 to a precharge potential VPRECH. During such a precharge operation, a selected PMC(s) can be connected to, or isolated from, program node 2026 depending upon the programming speed (how fast it can take a PMC to reach a desired programmed state). In the case of a "fast" programming PMC elements, such a fast PMC element can be isolated from program node 2026 during precharge. Conversely, in the case of a "slow" programming PMC elements, such a slow PMC element can be connected to program node 2026 during precharge.

At about time t1, signal PRCH can return to an inactive state, disabling precharge circuit 2028-0. At about this time, current source 2028-1 can be enabled or continue to be enabled. This can continue the programming operation until impedance of an accessed PMC(s) has been determined to be at a desired level.

Current source 2028-1 can provide less current than a path created by precharge circuit 2028-0, but enough current to enable a verify operation to take place.

At about time t2, based on a current provided by current source 2028-1, a signal generator 2030 can activate a verify signal PR_VER. In the particular example of FIG. 20B, activation of signal PR_VER can result in signal PROG_EN being driven to an inactive state, which can then disable current source 2028-1.

In this way, a program and verify circuit can have a precharge circuit that sources current to, or sinks current from, a PMC memory array during an initial part of a program operation. A current source can provide less current than that of the precharge operation, and can be used to verify a programmed state of the PMC(s).

Figure 21A:
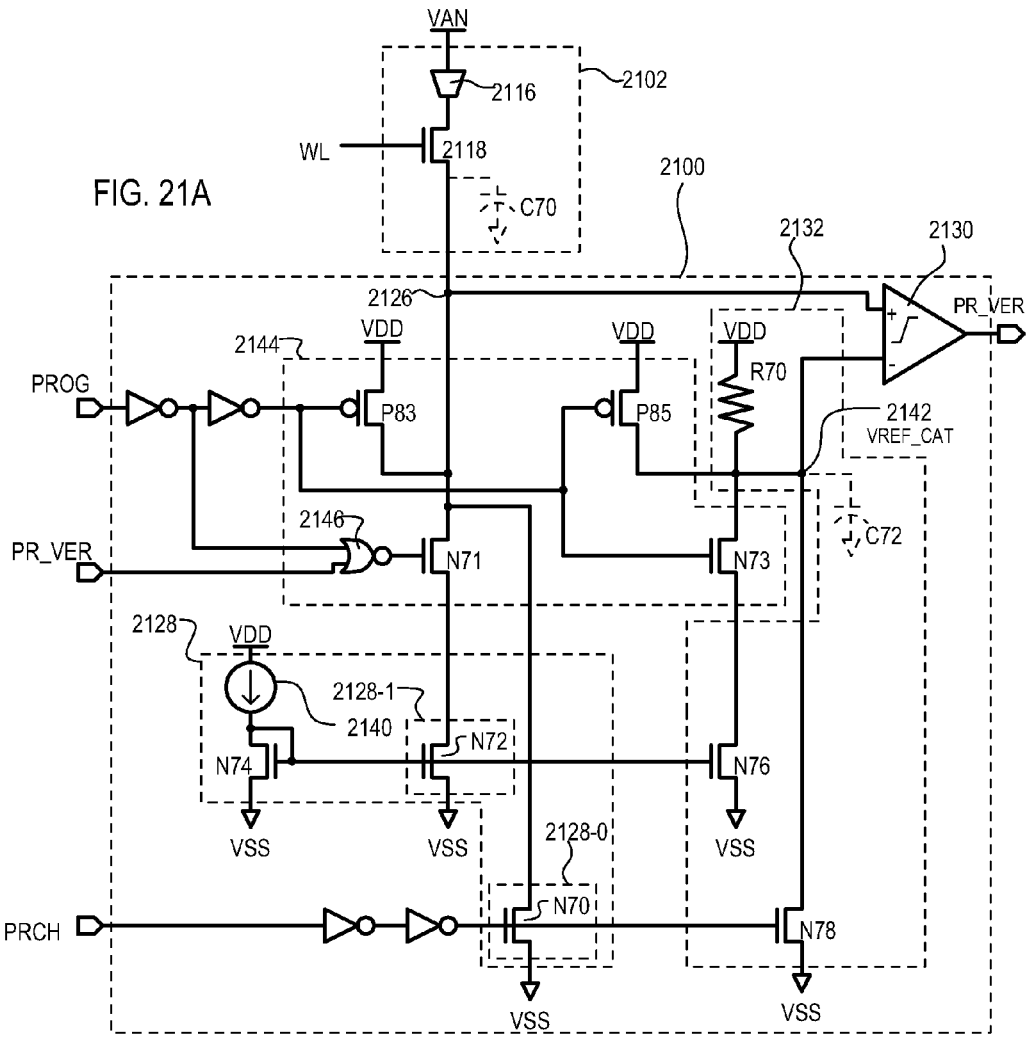
FIG. 21A is a schematic diagram of a program and verify section according to another embodiment.
Figure 21B:
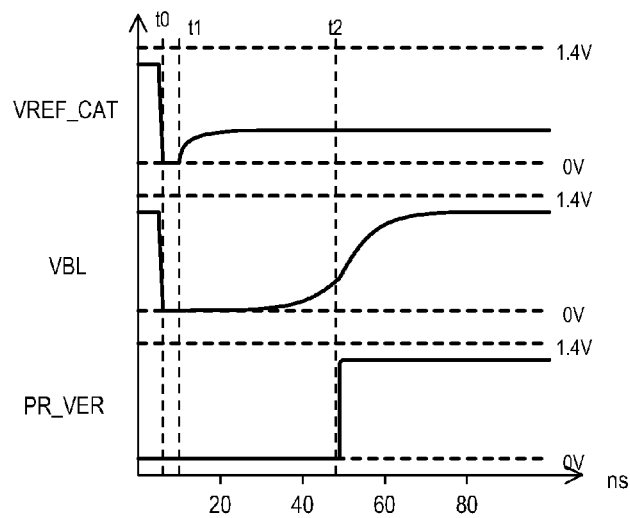
FIG. 21B is a timing diagram showing an example of a programming operation for the circuit of FIG. 21A.

Referring now to FIGS. 21A and 21B, a program and verify section according to a further embodiment is shown in a schematic diagram, and designated by the general reference character 2100. This example can also be one version of that shown as 1712-0 to 1712-n in FIG. 17. FIG. 21A shows a program and verify section 2100 that can include features like those of FIG. 20A. Such like features are referred to with a same reference character but with the first digits being "21" instead of "20". FIG. 21B is a timing diagram showing one operation of the embodiment shown in FIG. 21A.

In the particular example of FIG. 21A, a PMC memory array 2102 is represented by a PMC 2116 selected by an access device 2118, which in this case is an NMOS transistor. An anode of PMC 2116 can be connected to a voltage VAN. In one particular arrangement, VAN can be driven to a high power supply voltage VDD in a program operation. A parasitic capacitance from bit lines, etc., is represented by capacitance C70.

Within program and verify section 2100, a program current source circuit 2128 can include a precharge device 2128-0 (which in this case is NMOS N70), a current source 2128-1 (which in this case is NMOS N72), verify current device N74, and verify current reference 2140. Verify current reference 2140 can provide a reference current to verify current device N74. Current source N72 is connected in a current mirror fashion to transistor N74, and thus will mirror current from current reference 2140. Precharge device N70 can be enabled in response to a precharge signal PRCH. In a preferred embodiment, precharge device N70 is sized to be larger than current source N72.

A reference circuit 2132 can provide a reference impedance sufficient to generate a desired reference voltage at reference node 2142. While the particular reference circuit 2132 is shown to include a reference resistance R70, it is understood that such a circuit element can include any of various structures, including but not limited to a PMC device, a poly resistor (resistor formed with polycrystalline and/or amorphous silicon), a MOS resistor, a diffusion resistor (resistor formed by a diffusion region in a semiconductor substrate), as but a few examples. A reference circuit 2132 can also include a reference current source N76 and a reference precharge device N78. Reference current source N76 can be connected in a current mirror arrangement with verify current device N74. Thus, reference current source N76 can provide a reference current that mirrors that from current reference 2140. Accordingly, when enabled, reference current source N76 can drawn current through resistor R70 to generate a reference voltage VREF_CAT at a reference node 2142 (input to comparator 2130). Reference precharge device N78 can be enabled in response to signal PRCH to place reference node 2142 to a known precharge potential, which in this case, can be a low power supply voltage VSS. A parasitic capacitance at reference node 2142 is represented by a capacitance C72.

A program and verify section 2100 can also include a disable circuit 2144 that can selectively enable program current source circuit 2128 and reference circuit 2132. Disable circuit 2144 can include program enable device N71, program disable device P83, reference enable device N73, and reference disable device P85.

When a program signal PROG has one value (in this example high), program enable device N71 can enable second current source N72 to sink current from program node 2126, and reference enable device N73 can enable reference current source N76 to sink current from reference node 2142. In contrast, when a program signal PROG has another value (in this example low), program enable device N71 can isolate second current source N72 from program node 2126, and reference enable device N73 can isolate reference current source N76 from reference node 2142. Further, program disable device P83 can drive program node 2126 to a disable potential (in this case VDD), and reference disable device P85 can drive reference node 2142 to the disable potential. In the example shown, the enabling/disabling of program enable device N71 is interlocked with signal PR_VER by control logic 2146, which in this case is a two-input NOR gate. Control logic 2146 can ensure that program enable device N71 is disabled in response to verify signal PR_VER (or program signal PROG).

Having described the general construction of program and verify section 2100, the operation of the circuit will now be described with reference to FIG. 21B. FIG. 21B shows a waveform VREF_CAT, which can be a voltage generated at reference node 2142, a waveform VBL which can be a voltage at program node 2126, and a waveform PR_VER, which can be the program verify signal output from signal generator 2130.

Referring now to FIG. 21A in conjunction with 21B, prior to time t0, signal PROG can be low, thus by operation of disable devices P83 and P85, program node 2126 and reference node 2142 are held at a disable potential VDD.

At about time t0, signal PRCH can be activated (in this case driven high) enabling precharge device N70 and precharge device N78. As a result, program node 2126 and reference node 2142 can both be driven to a precharge voltage, which in this case is VSS (e.g., 0 volts).

At about time t1, signal PRCH can be deactivated, turning off devices N70 and N78. In addition, signal PROG can be activated (in this case driven high). This can turn off disable devices P83 and P85, and turn on enable devices N71 and N73. At the same time, or about the same time, word line WL can be activated to select PMC 2116. As a result, second current source N72 can sink current and start programming PMC 2116, while reference current source N76 can sink current and generate a reference voltage VER_CAT at reference node 2142. As a result PMC 2116 can start to be programmed.

As PMC 2116 is programmed from a higher impedance state to a lower impedance state, a voltage at program node 2126 will rise, and eventually exceed the reference voltage VER_CAT.

At about time t2, VBL can be greater than VREF_CAT, causing signal generator 2130 to activate the program verify signal PR_VER. This signal is fed back to control logic 2146 resulting in second current source N72 being disabled. At this point, PMC 2116 can be programmed, and its programmed state considered verified.

In this way, a program and verify section can include disable circuits that can selectively place a program node and/or reference node to a predetermined voltage when program operations are not taking place. In addition, both a program and reference node can be precharged to a same potential prior to a program operation. Such a feature can advantageously eliminate capacitive current that could delay or otherwise adversely affect program operations.

Figure 22A:
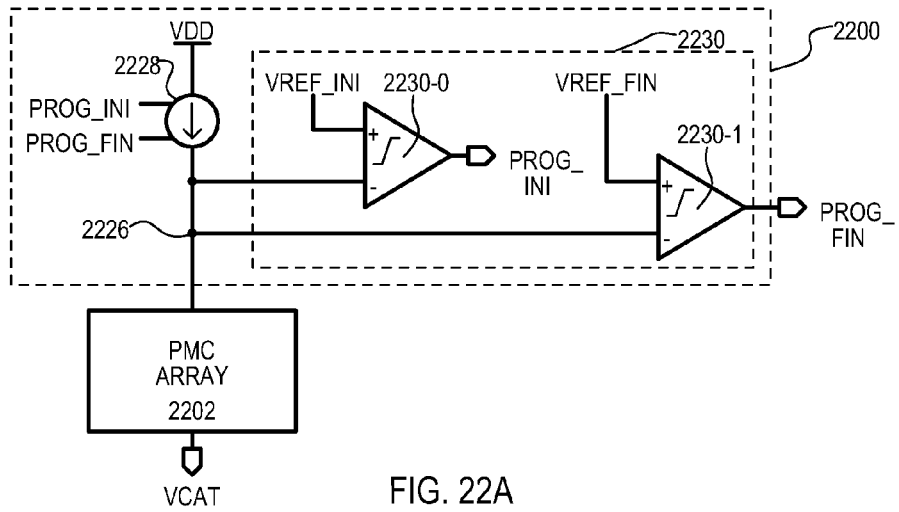
FIGS. 22A and 22B are block schematic diagrams of program and verify sections according to other embodiments.
Figure 22B:
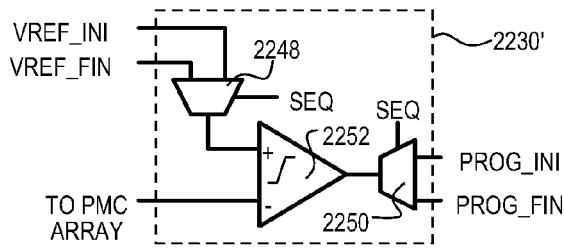

Referring now to FIGS. 22A and 22B, program and verify sections according to additional embodiments are shown in block schematic diagrams. FIG. 22A shows a program and verify circuit designated by the general reference character 2200. This example can also be one version of that shown as 1712-0 to 1712-n in FIG. 17. FIG. 22A shows a circuit that can include features like those of FIG. 18. Such like features are referred to with a same reference character but with the first digits being "22" instead of "18".

The arrangement of FIG. 22A can differ from that of FIG. 18 in that a signal generator 2230 can include a first comparator 2230-0 and a second comparator 2230-1. First comparator 2230-0 can generate a program initialization signal PROG_INI by comparing a voltage at program node 2226 with a first reference voltage VREF_INI. Second comparator 2230-1 can generate a program end signal PROG_FIN by comparing a voltage at program node 2226 with a second reference voltage VREF_FIN.

A program current source circuit 2228 can be disabled in response to signal PROG_INI.

The arrangement of FIG. 22A can advantageously address PMCs that can provide an initial low impedance, but then return to a higher impedance state. In one particular arrangement, program operations can start with a program phase that enables program current source 2228 and selects a PMC(s) as described above. First comparator 2230-0 can activate signal PROG_INI base on a first detected impedance. Program current source 2228 can be disabled in response to signal PROG_INI.

In a verify phase, a program current source circuit 2228 can then be enabled again, to provide a same or smaller current. Second comparator 2230-1 can then compare a resulting voltage at program node 2226 to second reference voltage VREF_FIN. Second reference voltage VREF_FIN can equate to a lower PMC resistance that VREF_INI. If VREF_FIN remains inactive, a program phase can be repeated, followed by another verify phase. Such operations can be repeated until a selected PMC(s) can be verified as programmed.

FIG. 22B shows an alternate signal generator 2230' that can be used in an arrangement like that shown in FIG. 22A. A comparator 2252 can have one of multiple reference voltages (in this case VREF_INI or VREF_FIN) switched to a reference input according to a verify select circuit 2248. Similarly, an output of comparator 2252 can be provided as either a signal PROG_INI or PROG_FIN, according to program signal select circuit 2250.

In this way, multiple compare operations can be used to initiate an initial program phase that stops at a first detected PMC resistance, followed by a program verify phase that activates a verify signal based on a second, lower PMC resistance.

Figure 22C:
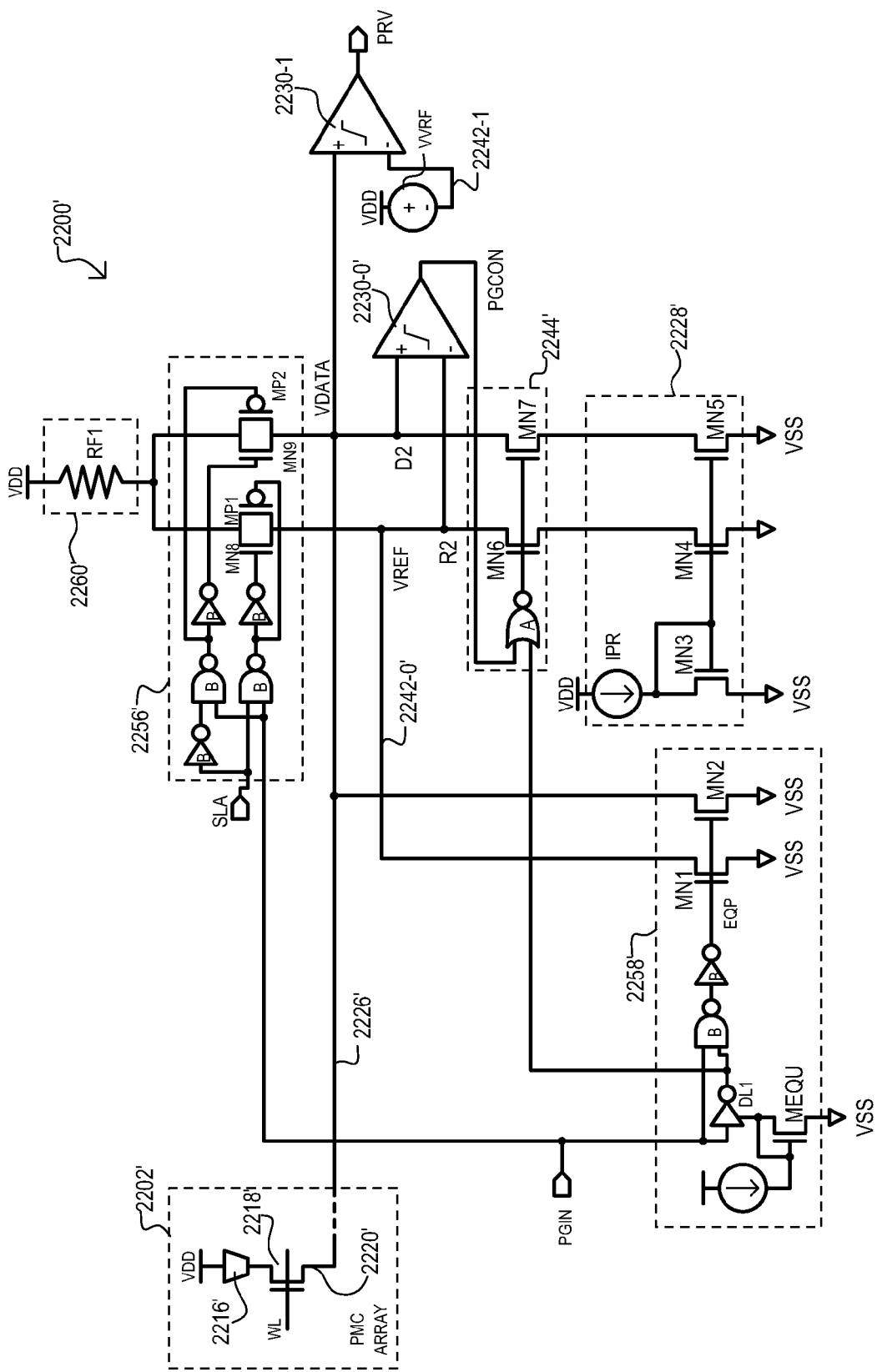
FIGS. 22C and 22D are a schematic diagram and timing diagram showing yet another program and verify section according to an embodiment.
Figure 22D:
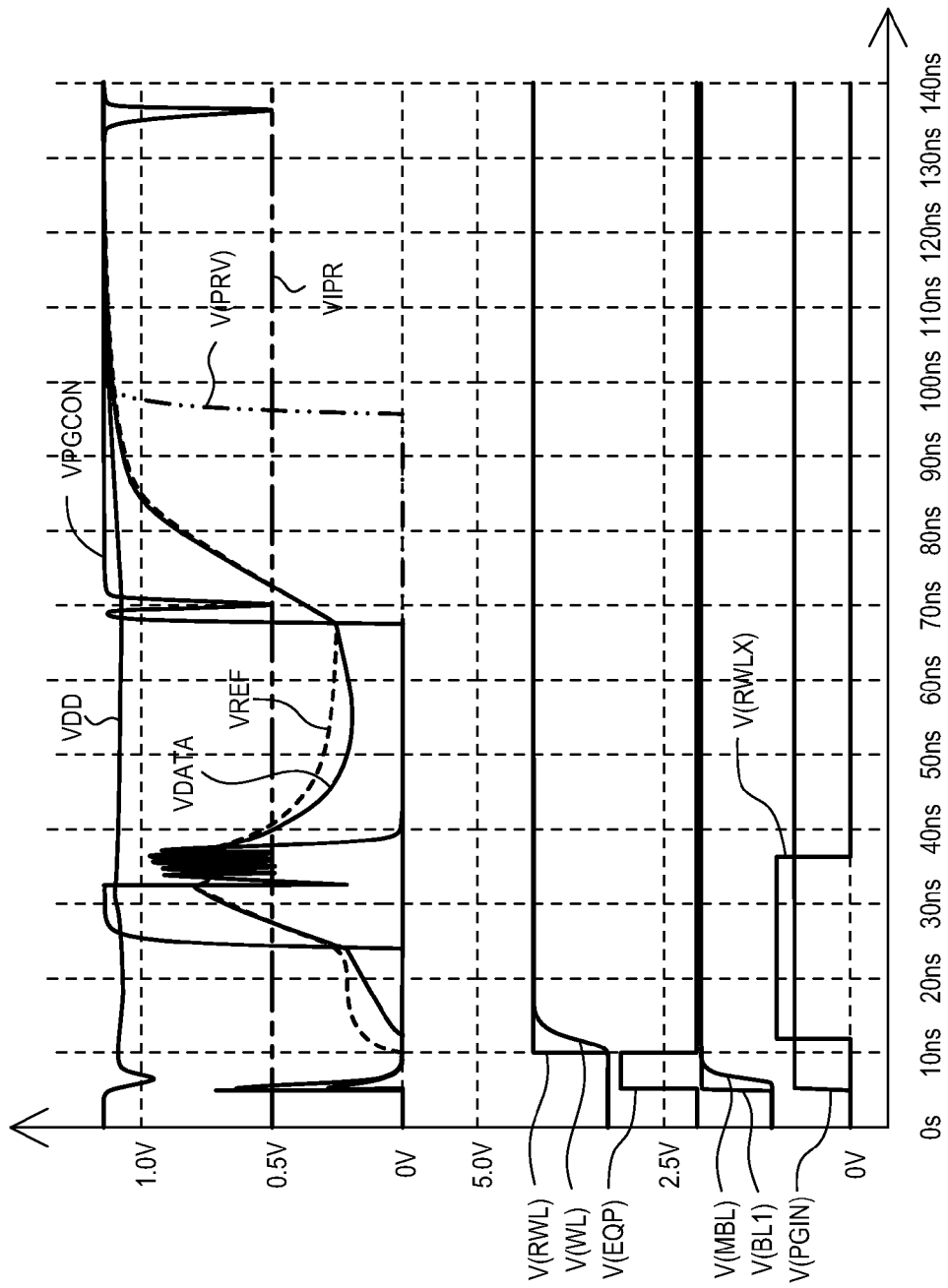

Referring now to FIGS. 22C and 22D, a program and verify section according to yet another embodiment is shown in a schematic diagram and a timing diagram. In the example shown, a program and verify operation can be conceptualized as having three stages. In a first, higher current stage, a selected PMC(s) can be subject to programming conditions until a first trip point, the first trip point being based on a comparison between the PMC(s) impedance and a reference impedance. In a second, lower current stage, the PMC(s) impedance can be checked again. If a target impedance is not detected (e.g., the PMC(s) has not retained the desired programmed state), the PMC(s) can be automatically subject to the programming conditions (return to first stage). If a target impedance is detected (e.g., the PMC(s) has retained the desired programmed state), a third stage can be reached, and a verify signal can be generated.

Referring to FIG. 22D, a PMC array 2202' is represented by a selectable PMC 2216' accessed by a MOS device 2218' in response to a select (e.g., word line) signal WL. A program and verify section 2200' can be connected to PMC array 2202' at a program node 2226', and can include a program current source 2228', a first comparator 2230-0', a second comparator 2230-1', a disable circuit 2244', a select circuit 2256', a precharge circuit 2258', and a reference circuit 2260'.

A precharge circuit 2258' can generate a pulse that can precharge both a first reference node 2242-0' and program node 2226' to a precharge voltage (in this example, low power supply voltage VSS).

In a first program and verify stage, precharge circuit 2258' is disabled, while disable circuit 2244' is enabled (placed into a low impedance state). As a result, both first reference node 2242-0' and program node 2226' can be connected to program current source circuit 2228'. At about the same time, or shortly thereafter, select circuit 2256' can connect a reference circuit 2260' (which includes a reference RC) to a first reference node 2242-0' and PMC(s) 2216' can be connected to program node 2226'. As a result, reference circuit 2260' will source current at a predetermined rate. PMC(s) 2216' will start to be programmed, and thus eventually drop in resistance as compared to reference circuit 2260'. This can be a higher power consuming stage as reference circuit 2260' and PMC 2216' are both sourcing current as program current source circuit 2228' sinks some of this current.

A first trip point is reached when a potential at program node 2226' exceeds that at first reference node 2242-0'. In response to this trip point, first comparator 2230-0' can place disable circuit 2244' into a high impedance state, isolating program current source circuit 2228' from first reference node 2242-0' and program node 2226'. This can cause the program and verify section 2200' to enter a second, lower power consuming stage.

In a second stage, reference circuit 2260' will start pulling first reference node 2242-0' high while the selected PMC(s) 2216' starts to pull program node 2226' high. If the selected PMC(s) 2216' pulls program node 2226' to a reference voltage before the reference node 2242-0', disable circuit 2244' will continue to isolate the PMC(s) from the current source circuit 2228'.

In contrast, if reference circuit 2260' "beats" the PMC(s) by pulling the program node 2226' higher than the program node 2226' before the program node can reach the reference potential, first comparator 2230-0' will drive its output low, and enable circuit 2244' will once again connect first reference node 2242-0' and program node 2226' to program current source circuit 2228'. In this way, the first stage is automatically initiated once again, with reference circuit 2260' and PMC 2216' both sourcing current to program current source circuit 2228'. Such a process can be repeated until a program state is verified (or the operation cancelled).

Assuming PMC(s) pulls program node 2226' to the reference potential before reference node 2242-0', second comparator 2230-1' can drive its output signal PRV high, indicating that the PMC(s) is considered to be verified as programmed.

FIG. 22D shows various waveforms of a program and verify operation for a circuit like that of FIG. 22C.

In this way, an initial program and verify operation can compare current drawn by a PMC(s) while it is connected to a programming current source. A lower power verify stage can compare the RC characteristics of the PMC(s) versus a reference RC after such a programming current source is disconnected from the PMC(s).

Figure 23:
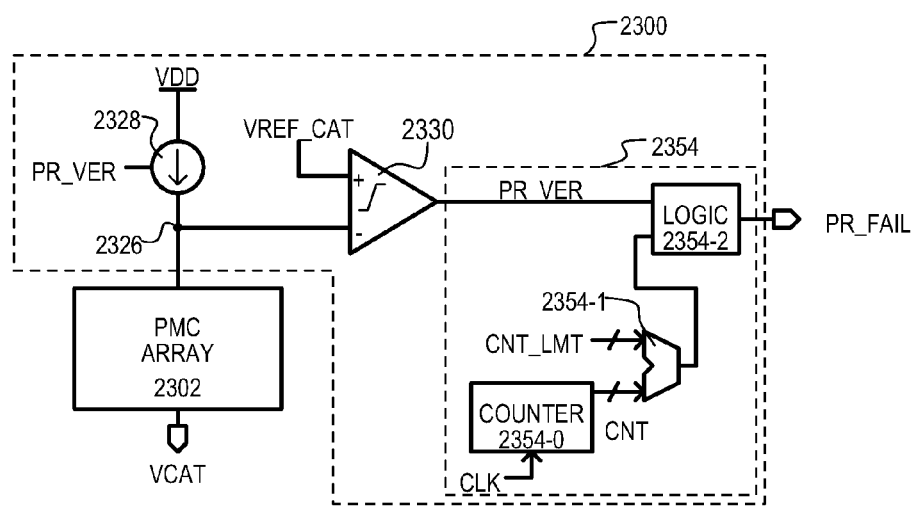
FIG. 23 is a block schematic diagram of program and verify section according to an embodiment.

Referring now to FIG. 23, a program and verify section according to a further embodiment is shown in a block schematic diagram, and designated by the general reference character 2300. This example can also be one version of that shown as 1712-0 to 1712-n in FIG. 17. FIG. 23 shows a circuit that can include features like those of FIG. 18. Such like features are referred to with a same reference character but with the first digits being "23" instead of "18".

The arrangement of FIG. 23 can differ from that of FIG. 18 in that it can include a timing circuit 2354. A timing circuit 2354 can require that a program verify signal PR_VER be generated within a predetermined time frame. For example, program operations can occur as noted above, in a repeated fashion (e.g., a sequence like that described for FIG. 21B), over a given period of time. If a program verify signal PR_VER cannot be generated, a selected PMC can be determined to be defective.

In the particular example shown, a timing circuit 2354 can include a counter circuit 2354-0, a count comparator 2354-1, and fail logic 2354-2. Counter circuit 2354-0 and count comparator 2354-1 can determine when a predetermined time period has passed. If signal PR_VER is not activated within such a time period, a fail logic 2354-2 can activate a fail indication PR_FAIL to signify that a selected PMC(s) could not be programmed to a desired resistance state within a set time period.

In this way, programming can be controlled according to a timing circuit.

Figure 24:
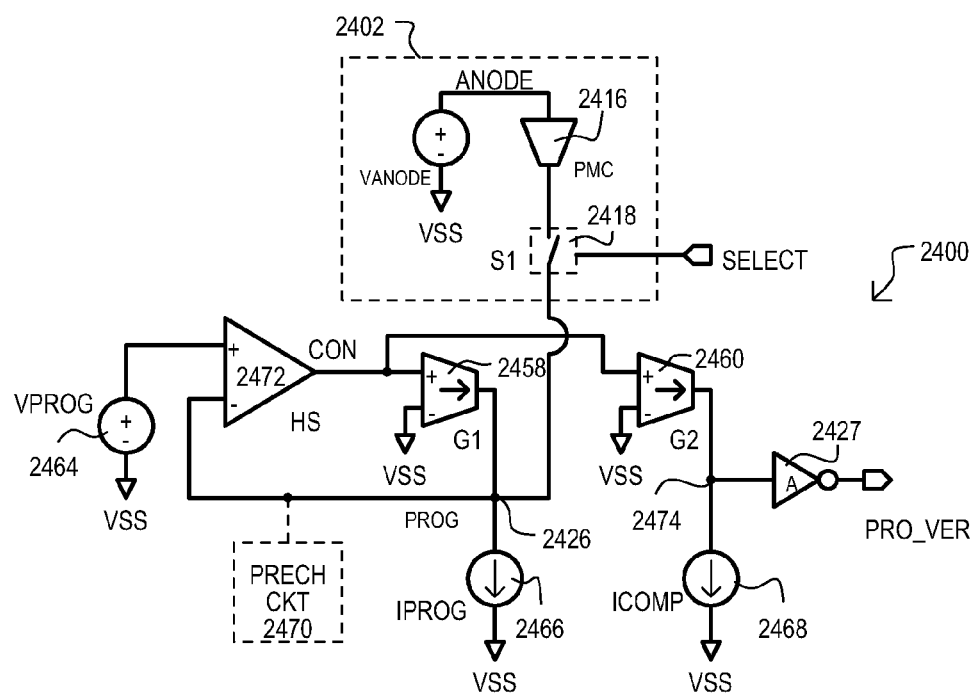
FIG. 24 is a block schematic diagram of a program and verify section according to yet another embodiment that can utilize shunt programming.

Referring to FIG. 24, a program and verify section according to yet another embodiment is shown in block schematic diagram. FIG. 24 shows a program and verify circuit designated by the general reference character 2400. This example can also be one version of that shown as 1712-0 to 1712-n in FIG. 17.

The arrangement of FIG. 24 can include an amplifier 2472, a program transconductor (transconductance circuit/device) 2458, a verify transconductor 2460, a verify signal generator 2427, a program voltage source 2464, a program current source 2466, and a verify current source 2468. Such components can be arranged as shown in FIG. 24. A PMC memory array 2402 can be connected to the program and verify circuit 2400 at a program node 2426.

Program and verify circuit 2400 can provide for "shunt" programming. In a shunt programming operation, a PMC can be connected to a program node and a suitable programming potential generated across the PMC. Initially, current at a program node is sourced/sunk by a program transconductor. As the PMC programs to a lower impedance state, more current is shunted through the PMC device.

The particular operation of the circuit in FIG. 24 will now be described.

Initially, program node 2426 can be forced to a programming voltage VPROG. This can be accomplished with a precharge circuit 2470 (shown by dashed lines), which can force program node 2426 VPROG. Alternatively, program transconductor 2460, in combination with amplifier 2472, program voltage source 2464 and program current source 2428 can force program node 2426 to VPROG (or about VPROG). During this initial phase, a PMC(s) may, or may not be connected to program node 2426. For example, if PMC 2416 can require a relatively long program time, PMC 2416 can be connected to program node 2426 by access device 2418 (and any other intervening circuitry) during this phase. Conversely, if a PMC has a shorter program time, it can be disconnected from program node 2426 at this time.

Once program node 2426 is at or about VPROG, PMC 2416 can be connected to program node 2426, if not already connected to such a node, and programming can start.

Initially, because PMC 2416 is not programmed, it can have relatively high resistance state. Consequently, the potential at program node 2426 is sufficiently lower than the VPROG causing amplifier 2472 to output a voltage CON that causes program transconductor 2458 to source essentially all programming current to program current source 2466. At the same time, amplifier output CON can also cause verify transconductor 2460 to source current to verify node 2474. Current sourced by verify transconductor 2460 can be greater than that sunk by verify current source 2468. As a result, inverting verify signal generator 2427 can drive its output PRO_VER low, indicating that the PMC 2416 has not yet been verified as programmed.

As PMC 2416 is programmed, its resistance can drop, resulting in PMC 2416 sourcing essentially all the current to program node 2426. Consequently, the potential at program node 2426 can rise, causing amplifier 2472 to output a voltage CON that causes program transconductor 2458 to turn off (provide essentially no current to program node 2426). At the same time, amplifier output CON can also cause verify transconductor 2460 to essentially turn off. This can cause verify current source 2468 to pull verify node 2474 low, a result, inverting verify signal generator 2427 can drive its output PRO_VER high, indicating that the PMC 2416 has been verified as programmed.

In this way, a program and verify circuit can use "shunt" programming to program and verify the programming of one or more PMCs.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A method, comprising the steps of:
  programming a selected programmable metallization cell (PMC) by coupling the anodes of a group of PMCs to a first power supply voltage and connecting a cathode of one of PMCs of the group to a second power supply voltage with a select device; and
  erasing a selected PMC by coupling the anodes of a group of PMCs to the second power supply voltage and connecting the cathode of one of PMCs of the group to the first supply voltage with the select device.

2. The method of claim 1, wherein:
  the anodes of the PMCs of the group are commonly connected to a bit line;
  programming the selected PMC includes coupling the bit line a write circuit via a bit line multiplexer (MUX); and
  erasing the selected PMC include coupling the bit line to the write circuit via the bit line MUX; wherein
  the write circuit receives the first and second power supply voltages.

3. The method of claim 1, wherein:
  the cathodes of the PMCs of the group are commonly connected to a source strap by corresponding select devices;
  programming the selected PMC includes coupling the source strap to the second power supply voltage with a source select circuit; and
  erasing the selected PMC include coupling the source strap to the first power supply voltage with the source select circuit.

4. The method of claim 1, wherein:
  the anodes of the PMCs of the group are commonly connected to a bit line;
  the bit line is coupled to a bit line selection circuit;
  programming the selected PMC includes driving the bit line to the first power supply voltage with bit line selection circuit; and
  erasing the selected PMC includes driving the bit line to the second power supply voltage with the bit line selection circuit.

5. The method of claim 4, wherein:
  programming the selected PMC includes enabling a p-channel transistor in the a bit line selection circuit that is coupled between the first power supply voltage and the bit line; and
  erasing the selected PMC includes enabling an n-channel transistor in the a bit line selection circuit that is coupled between the second power supply voltage and the bit line.

6. The method of claim 1, further including:
  reading a selected PMC by coupling the anodes of a group of PMCs to a read voltage and connecting the cathode of one of PMCs of the group of to the second power supply voltage with the select device.

7. The method of claim 6, wherein:
  the anodes of the PMCs of the group are commonly connected to a bit line; and
  reading the selected PMC includes coupling the bit line to the read voltage with a bit line multiplexer (MUX).

8. The method of claim 6, wherein:
  the cathodes of the PMCs of the group are commonly connected to a source strap by corresponding select devices; and
  reading the selected PMC includes coupling the bit line to the second power supply voltage.

9. The method of claim 1, further including:
  de-selecting a PMC from programming or erasing by electrically isolating the anodes of the group of PMCs that includes the de-selected PMC, and electrically isolating the select device coupled to the de-selected PMC.

10. The method of claim 9, wherein:
  the anodes of the PMCs of the group are commonly connected to a bit line;
  the bit line is coupled to a bit line selection circuit; and
  de-selecting the PMC includes
    disabling a p-channel transistor in the a bit line selection circuit to isolate the bit line from the first power supply voltage, and
    disabling an n-channel transistor in the a bit line selection circuit to isolate the bit line from the second power supply voltage.

11. The method of claim 1, further including:
  de-selecting a PMC by coupling the anodes of the group of PMCs to a de-select potential, and coupling the select device coupled to the de-selected PMC to a de-select potential.

12. The method of claim 11, wherein:
  the de-select potential is the second power supply voltage.

13. The method of claim 11, wherein:
  the de-select potential is between the first power supply voltage and the second power supply voltage.

14. The method of claim 1, wherein:
  the cathodes of the PMCs of the group are commonly connected to a source strap by corresponding select devices; and
  programming the selected PMC includes disabling the select devices corresponding to the non-selected PMCs of the group.

15. The method of claim 1, wherein:
  the cathodes of the PMCs of the group are commonly connected to a source strap by corresponding select devices; and erasing the selected PMC includes disabling the select devices corresponding to the non-selected PMCs of the group.

16. The method of claim 1, wherein:

the cathodes of the PMCs of the group are commonly connected to a source strap by corresponding select devices, each select device is coupled to a different word line; and programming the selected PMC includes activating one word line while de-activating the other word lines.

17. The method of claim 1, wherein:

the cathodes of the PMCs of the group are commonly connected to a source strap by corresponding select devices, each select device is coupled to a different word line; and erasing the selected PMC includes activating one word line while de-activating the other word lines.

* * * * *